(12) United States Patent
Kumar et al.

(10) Patent No.: US 7,638,727 B2
(45) Date of Patent: *Dec. 29, 2009

(54) PLASMA-ASSISTED HEAT TREATMENT

(75) Inventors: Satyendra Kumar, Troy, MI (US); Devendra Kumar, Rochester Hills, MI (US); Michael L. Dougherty, Rochester Hills, MI (US)

(73) Assignee: BTU International Inc., N. Billerica, MA (US)

( * ) Notice: Subject to any disclaimer, the term of this patent is extended or adjusted under 35 U.S.C. 154(b) by 65 days.

This patent is subject to a terminal disclaimer.

(21) Appl. No.: 10/513,604

(22) PCT Filed: May 7, 2003

(86) PCT No.: PCT/US03/14136

§ 371 (c)(1), (2), (4) Date: Aug. 5, 2005

(87) PCT Pub. No.: WO03/096749

PCT Pub. Date: Nov. 20, 2003

(65) Prior Publication Data

US 2006/0124613 A1    Jun. 15, 2006

Related U.S. Application Data

(60) Provisional application No. 60/378,693, filed on May 8, 2002, provisional application No. 60/430,677, filed on Dec. 4, 2002, provisional application No. 60/435,278, filed on Dec. 23, 2002.

(51) Int. Cl.
*B23K 10/00* (2006.01)
*H05H 1/46* (2006.01)

(52) U.S. Cl. .............. 219/121.41; 219/121.43; 219/121.44; 219/121.59; 427/575; 427/577; 315/111.41; 118/723 R; 118/723 MW

(58) Field of Classification Search ............ 219/121.41, 219/121.43, 121.59, 700, 701; 204/298.38; 148/218; 156/345.3, 345.41; 216/69, 70; 427/569, 575, 577

See application file for complete search history.

(56) References Cited

U.S. PATENT DOCUMENTS 2,588,262 A * 3/1952 Matare .................... 333/81 R (Continued)

FOREIGN PATENT DOCUMENTS

DE       222 348 A1    5/1985

(Continued)

OTHER PUBLICATIONS

Agrawal et al., "Grain Growth Control in Microwave Sintering of Ultrafine WC-Co Composite Powder Compacts," Euro PM99, Sintering, Italy, 8 pages (1999).

(Continued)

*Primary Examiner*—Tu B Hoang
*Assistant Examiner*—Stephen J Ralis
(74) *Attorney, Agent, or Firm*—Weingarten, Schurgin, Gagnebin & Lebovici LLP

(57) ABSTRACT

Methods and apparatus for plasma-assisted heat treatments are provided. The method can include initiating a heat treating plasma within a cavity (14) by subjecting a gas to electromagnetic radiation in the presence of a plasma catalyst (70), heating the object by exposing the object to the plasma, and maintaining exposure of the object to the plasma for a sufficient period to alter at least one material property of the object.

34 Claims, 8 Drawing Sheets

U.S. PATENT DOCUMENTS

| | | | |
|---|---|---|---|
| 3,432,296 A | 3/1969 | McKinnon et al. | |
| 3,612,686 A | 10/1971 | Braman | |
| 3,731,047 A | 5/1973 | Mullen et al. | |
| 4,004,934 A | 1/1977 | Prochazka | |
| 4,025,818 A | 5/1977 | Giguere | |
| 4,049,473 A * | 9/1977 | Davis et al. | 148/216 |
| 4,090,055 A | 5/1978 | King | |
| 4,147,911 A | 4/1979 | Nishitani | |
| 4,151,034 A | 4/1979 | Yamamoto et al. | |
| 4,213,818 A | 7/1980 | Lemons et al. | |
| 4,221,972 A * | 9/1980 | Oppel et al. | 422/186.06 |
| 4,230,448 A | 10/1980 | Ward et al. | |
| 4,265,730 A | 5/1981 | Hirose et al. | |
| 4,307,277 A | 12/1981 | Maeda | |
| 4,339,326 A | 7/1982 | Hirose et al. | |
| 4,404,456 A | 9/1983 | Cann | |
| 4,473,736 A | 9/1984 | Bloyet et al. | |
| 4,479,075 A | 10/1984 | Elliott | |
| 4,500,564 A | 2/1985 | Enomoto | |
| 4,504,007 A | 3/1985 | Anderson, Jr. | |
| 4,589,424 A * | 5/1986 | Vaguine | 607/154 |
| 4,609,808 A | 9/1986 | Bloyet et al. | |
| 4,611,108 A | 9/1986 | Leprince et al. | |
| 4,624,738 A | 11/1986 | Westfall et al. | |
| 4,664,937 A | 5/1987 | Ovshinsky et al. | |
| 4,666,775 A | 5/1987 | Kim et al. | |
| 4,687,560 A | 8/1987 | Tracy | |
| 4,698,234 A | 10/1987 | Ovshinsky | |
| 4,760,230 A | 7/1988 | Hassler | |
| 4,767,902 A | 8/1988 | Palaith | |
| 4,772,770 A | 9/1988 | Matsui | |
| 4,792,348 A | 12/1988 | Pekarsky | |
| 4,840,139 A | 6/1989 | Takei | |
| 4,871,581 A | 10/1989 | Yamazaki | |
| 4,877,589 A | 10/1989 | O'Hare | |
| 4,877,938 A | 10/1989 | Rau et al. | |
| 4,883,570 A | 11/1989 | Efthimion et al. | |
| 4,888,088 A | 12/1989 | Slomowitz | |
| 4,891,488 A | 1/1990 | Davis | |
| 4,897,285 A | 1/1990 | Wilhelm | |
| 4,908,492 A | 3/1990 | Okamoto et al. | |
| 4,919,077 A | 4/1990 | Oda | |
| 4,924,061 A | 5/1990 | Labat | |
| 4,946,547 A | 8/1990 | Palmour | |
| 4,956,590 A | 9/1990 | Phillips | |
| 4,963,709 A | 10/1990 | Kimrey | |
| 4,972,799 A | 11/1990 | Misumi | |
| 5,003,125 A | 3/1991 | Giusti | |
| 5,003,152 A | 3/1991 | Matsuo | |
| 5,010,220 A | 4/1991 | Apte | |
| 5,017,404 A | 5/1991 | Paquet | |
| 5,023,056 A * | 6/1991 | Aklufi et al. | 422/186 |
| 5,058,527 A | 10/1991 | Ohta et al. | |
| 5,072,650 A | 12/1991 | Phillips | |
| 5,074,112 A | 12/1991 | Walton | |
| 5,085,885 A | 2/1992 | Foley et al. | |
| 5,087,272 A | 2/1992 | Nixdorf | |
| 5,103,715 A | 4/1992 | Phillips | |
| 5,120,567 A | 6/1992 | Frind et al. | |
| 5,122,633 A | 6/1992 | Moshammer | |
| 5,131,993 A | 7/1992 | Suib et al. | |
| 5,164,130 A | 11/1992 | Holcombe | |
| 5,202,541 A | 4/1993 | Patterson | |
| 5,222,448 A | 6/1993 | Morgenthaler et al. | |
| 5,223,308 A | 6/1993 | Doehler | |
| 5,224,117 A | 6/1993 | Kruger et al. | |
| 5,227,695 A | 7/1993 | Pelletier | |
| 5,271,963 A | 12/1993 | Elchman et al. | |
| 5,276,297 A | 1/1994 | Nara | |
| 5,277,386 A | 1/1994 | Watanabe | |
| 5,277,773 A | 1/1994 | Murphy | |
| 5,284,544 A | 2/1994 | Mizutani et al. | |
| 5,304,766 A | 4/1994 | Baudet et al. | |
| 5,307,892 A | 5/1994 | Phillips | |
| 5,310,426 A | 5/1994 | Mori | |
| 5,311,906 A | 5/1994 | Phillips | |
| 5,316,043 A | 5/1994 | Phillips | |
| 5,321,223 A | 6/1994 | Kimrey | |
| 5,349,154 A | 9/1994 | Harker et al. | |
| 5,366,764 A | 11/1994 | Sunthankar | |
| 5,370,525 A | 12/1994 | Gordon | |
| 5,423,180 A | 6/1995 | Nobue et al. | |
| 5,435,698 A | 7/1995 | Phillips | |
| 5,449,887 A | 9/1995 | Holcombe | |
| 5,505,275 A | 4/1996 | Phillips | |
| 5,514,217 A | 5/1996 | Niino | |
| 5,520,740 A | 5/1996 | Kanai | |
| 5,521,360 A | 5/1996 | Johnson et al. | |
| 5,523,126 A | 6/1996 | Sano | |
| 5,527,391 A | 6/1996 | Echizen et al. | |
| 5,536,477 A | 7/1996 | Cha et al. | |
| 5,597,456 A | 1/1997 | Maruyama et al. | |
| 5,607,509 A | 3/1997 | Schumacher | |
| 5,616,373 A | 4/1997 | Karner | |
| 5,645,897 A | 7/1997 | Andra | |
| 5,651,825 A | 7/1997 | Nakahigashi et al. | |
| 5,662,965 A | 9/1997 | Deguchi | |
| 5,670,065 A | 9/1997 | Bickmann et al. | |
| 5,671,045 A | 9/1997 | Woskov | |
| 5,682,745 A | 11/1997 | Phillips | |
| 5,689,949 A | 11/1997 | DeFreitas | |
| 5,712,000 A | 1/1998 | Wei et al. | |
| 5,714,009 A * | 2/1998 | Boling | 118/723 MW |
| 5,714,010 A | 2/1998 | Matsuyama et al. | |
| 5,715,677 A | 2/1998 | Wallman et al. | |
| 5,734,501 A | 3/1998 | Smith | |
| 5,735,451 A | 4/1998 | Mori | |
| 5,741,364 A | 4/1998 | Kodama | |
| 5,755,097 A | 5/1998 | Phillips | |
| 5,794,113 A | 8/1998 | Munir et al. | |
| 5,796,080 A | 8/1998 | Jennings | |
| 5,808,282 A | 9/1998 | Apte | |
| 5,828,338 A | 10/1998 | Gerstenberg | |
| 5,841,237 A | 11/1998 | Alton | |
| 5,847,355 A | 12/1998 | Barmatz et al. | |
| 5,848,348 A | 12/1998 | Dennis | |
| 5,859,404 A | 1/1999 | Wei | |
| 5,868,871 A | 2/1999 | Yokose et al. | |
| 5,874,705 A | 2/1999 | Duan | |
| 5,904,993 A | 5/1999 | Takeuchi | |
| 5,939,026 A | 8/1999 | Seki et al. | |
| 5,945,351 A | 8/1999 | Mathuni | |
| 5,954,882 A * | 9/1999 | Wild et al. | 118/723 MW |
| 5,961,773 A | 10/1999 | Ichimura et al. | |
| 5,961,871 A | 10/1999 | Bible et al. | |
| 5,973,289 A | 10/1999 | Read et al. | |
| 5,976,429 A | 11/1999 | Chen | |
| 5,980,843 A | 11/1999 | Silversand | |
| 5,980,999 A | 11/1999 | Goto et al. | |
| 5,989,477 A | 11/1999 | Berger | |
| 5,993,612 A | 11/1999 | Rostaing et al. | |
| 5,998,774 A | 12/1999 | Joines et al. | |
| 6,011,248 A | 1/2000 | Dennis | |
| 6,028,393 A | 2/2000 | Izu | |
| 6,038,854 A | 3/2000 | Penetrante et al. | |
| 6,054,693 A | 4/2000 | Barmatz et al. | |
| 6,054,700 A | 4/2000 | Rokhvarger | |
| 6,096,389 A | 8/2000 | Kanai | |
| 6,101,969 A | 8/2000 | Niori | |
| 6,103,068 A | 8/2000 | Merten et al. | |
| 6,122,912 A | 9/2000 | Phillips | |
| 6,131,386 A | 10/2000 | Trumble | |
| 6,132,550 A | 10/2000 | Shiomi | |
| 6,149,985 A | 11/2000 | Grace et al. | |

| | | | | | | |
|---|---|---|---|---|---|---|
| 6,152,254 | A | 11/2000 | Phillips | EP | 0 435 591 A | 7/1991 |
| 6,153,868 | A | 11/2000 | Marzat | EP | 0 436 361 A1 | 7/1991 |
| 6,183,689 | B1 | 2/2001 | Roy et al. | EP | 0 520 719 B1 | 12/1992 |
| 6,184,427 | B1 * | 2/2001 | Klepfer et al. ............... 585/241 | EP | 0 670 666 B1 | 9/1995 |
| 6,186,090 | B1 | 2/2001 | Dotter | EP | 0 520 719 B1 | 5/1996 |
| 6,189,482 | B1 | 2/2001 | Zhao | EP | 0 724 720 B1 | 8/1996 |
| 6,204,606 | B1 | 3/2001 | Spence | EP | 0 670 666 B1 | 6/1998 |
| 6,224,836 | B1 | 5/2001 | Moisan et al. | EP | 0 724 720 B1 | 5/2000 |
| 6,228,773 | B1 | 5/2001 | Cox | EP | 1 093 846 A1 | 4/2001 |
| 6,238,629 | B1 | 5/2001 | Barankova et al. | EP | 1 427 265 A2 | 6/2004 |
| 6,248,206 | B1 | 6/2001 | Herchen et al. | JP | 56-140021 A2 | 11/1981 |
| 6,264,812 | B1 | 7/2001 | Raaijmakers et al. | JP | 57-119164 A2 | 7/1982 |
| 6,284,202 | B1 | 9/2001 | Cha et al. | JP | 58-025073 A | 2/1983 |
| 6,287,980 | B1 | 9/2001 | Hanazaki et al. | JP | 59-169053 A | 9/1984 |
| 6,287,988 | B1 | 9/2001 | Nagamine et al. | JP | 62-000535 A | 1/1987 |
| 6,297,172 | B1 | 10/2001 | Kashiwagi | JP | 04-74858 | 3/1992 |
| 6,297,595 | B1 | 10/2001 | Stimson | JP | 06-345541 A | 12/1994 |
| 6,329,628 | B1 | 12/2001 | Kuo | JP | 07-153405 A | 6/1995 |
| 6,342,195 | B1 | 1/2002 | Roy et al. | JP | 09-235686 A | 2/1996 |
| 6,345,497 | B1 | 2/2002 | Penetrante et al. | JP | 08-217558 A | 8/1996 |
| 6,348,158 | B1 | 2/2002 | Samukawa | JP | 08-281423 A | 10/1996 |
| 6,358,361 | B1 | 3/2002 | Matsumoto | JP | 09-017597 A | 1/1997 |
| 6,362,449 | B1 | 3/2002 | Hadidi | JP | 09-023458 A | 1/1997 |
| 6,365,885 | B1 | 4/2002 | Roy et al. | JP | 09-027459 A | 1/1997 |
| 6,367,412 | B1 | 4/2002 | Ramaswamy et al. | JP | 09-027482 A | 1/1997 |
| 6,370,459 | B1 | 4/2002 | Phillips | JP | 09-078240 A | 3/1997 |
| 6,372,304 | B1 | 4/2002 | Sano et al. | JP | 09-102400 A | 4/1997 |
| 6,376,027 | B1 | 4/2002 | Lee et al. | JP | 09-102488 A | 4/1997 |
| 6,383,333 | B1 | 5/2002 | Haino et al. | JP | 09-111461 A | 4/1997 |
| 6,383,576 | B1 | 5/2002 | Matsuyama | JP | 09-137274 A | 5/1997 |
| 6,388,225 | B1 | 5/2002 | Blum et al. | JP | 09-157048 A | 6/1997 |
| 6,392,350 | B1 | 5/2002 | Amano | JP | 09-223596 A | 8/1997 |
| 6,407,359 | B1 | 6/2002 | Lagarde et al. | JP | 09-235686 A | 9/1997 |
| 6,488,112 | B1 | 12/2002 | Kleist | JP | 09-251971 A | 9/1997 |
| 6,512,216 | B2 | 1/2003 | Gedevanishvili et al. | JP | 09-295900 A | 11/1997 |
| 6,522,055 | B2 | 2/2003 | Uemura et al. | JP | 10-066948 A | 3/1998 |
| 6,575,264 | B2 | 6/2003 | Spadafora | JP | 10-081588 A | 3/1998 |
| 6,592,664 | B1 | 7/2003 | Frey et al. | JP | 10-081970 A | 3/1998 |
| 6,610,611 | B2 | 8/2003 | Liu et al. | JP | 10-087310 A | 4/1998 |
| 6,712,298 | B2 | 3/2004 | Kohlberg et al. | JP | 10-204641 A | 8/1998 |
| 6,717,368 | B1 | 4/2004 | Skamoto et al. | JP | 10-259420 A | 9/1998 |
| 6,870,124 | B2 | 3/2005 | Kumar et al. | JP | 10-294306 A | 11/1998 |
| 2001/0027023 | A1 | 10/2001 | Ishihara et al. | JP | 11-031599 A | 2/1999 |
| 2001/0028919 | A1 | 10/2001 | Liu et al. | JP | 11-106947 A | 4/1999 |
| 2002/0034461 | A1 | 3/2002 | Segal | JP | 11-145116 A | 5/1999 |
| 2002/0036187 | A1 | 3/2002 | Ishll et al. | JP | 11-186222 A | 7/1999 |
| 2002/0124867 | A1 | 9/2002 | Kim et al. | JP | 11-228290 A | 8/1999 |
| 2002/0135308 | A1 | 9/2002 | Janos et al. | JP | 11-265885 A | 9/1999 |
| 2002/0140381 | A1 | 10/2002 | Golkowski et al. | JP | 11-273895 A | 10/1999 |
| 2002/0190061 | A1 | 12/2002 | Gerdes et al. | JP | 11-297266 A | 10/1999 |
| 2002/0197882 | A1 | 12/2002 | Niimi et al. | JP | 2000-012526 A | 1/2000 |
| 2003/0071037 | A1 | 4/2003 | Sato et al. | JP | 2000-173989 A | 6/2000 |
| 2003/0111334 | A1 | 6/2003 | Dodelet et al. | JP | 2000-203990 A | 7/2000 |
| 2003/0111462 | A1 | 6/2003 | Sato et al. | JP | 2000-269182 A | 9/2000 |
| 2004/0001295 | A1 | 1/2004 | Kumar et al. | JP | 2000-288382 A | 10/2000 |
| 2004/0004062 | A1 | 1/2004 | Kumar et al. | JP | 2000-306901 A | 11/2000 |
| 2004/0045636 | A1 * | 3/2004 | Poirier et al. ............... 148/218 | JP | 2000-310874 A | 11/2000 |
| 2004/0070347 | A1 | 4/2004 | Nishida et al. | JP | 2000-310876 A | 11/2000 |
| 2004/0089631 | A1 | 5/2004 | Blalock et al. | JP | 2000-317303 A | 11/2000 |
| 2004/0107796 | A1 | 6/2004 | Kumar et al. | JP | 2000-323463 A | 11/2000 |
| 2004/0107896 | A1 | 6/2004 | Kumar et al. | JP | 2000-348897 A | 12/2000 |
| 2004/0118816 | A1 | 6/2004 | Kumar et al. | JP | 2001-013719 A | 1/2001 |
| | | | | JP | 2001-053069 A | 2/2001 |
| | | FOREIGN PATENT DOCUMENTS | | JP | 2001-058127 A | 3/2001 |
| | | | | JP | 2001-093871 A | 4/2001 |
| DE | | 195 42 352 A1 | 5/1997 | JP | 2001-149754 A | 6/2001 |
| DE | | 100 05 146 A1 | 8/2001 | JP | 2001-149918 A | 6/2001 |
| EP | | 0 228 864 B1 | 7/1987 | JP | 2001-196420 A | 7/2001 |
| EP | | 0 335 675 A2 | 10/1989 | JP | 2001-303252 A | 10/2001 |
| EP | | 0 435 591 A2 | 12/1990 | JP | 2001-332532 A | 11/2001 |
| EP | | 0 436 361 A1 | 12/1990 | JP | 2001-351915 A | 12/2001 |
| EP | | 0 228 864 B1 | 3/1991 | JP | 2002-022135 A | 1/2002 |
| EP | | 0 420 101 A2 | 4/1991 | JP | 2002-028487 A | 1/2002 |

| | | | |
|---|---|---|---|
| JP | 2002-069643 A | 3/2002 | |
| JP | 2002-075960 A | 3/2002 | |
| JP | 2002-126502 A | 5/2002 | |
| JP | 2002-273161 A | 9/2002 | |
| JP | 2002-273168 A | 9/2002 | |
| JP | 2003-075070 A | 3/2003 | |
| JP | 2003-264057 A | 9/2003 | |
| WO | WO 95-11442 A1 | 4/1995 | |
| WO | WO 96/06700 A1 | 3/1996 | |
| WO | WO 96/38311 A1 | 12/1996 | |
| WO | WO 97-13141 A1 | 4/1997 | |
| WO | WO 01-55487 A2 | 8/2001 | |
| WO | WO 01-58223 A1 | 8/2001 | |
| WO | WO 01-82332 A1 | 11/2001 | |
| WO | WO 02-26005 A1 | 3/2002 | |
| WO | WO 02-061165 A1 | 8/2002 | |
| WO | WO 02-061171 A1 | 8/2002 | |
| WO | WO 02-062114 A1 | 8/2002 | |
| WO | WO 02-062115 A1 | 8/2002 | |
| WO | WO 02-067285 A2 | 8/2002 | |
| WO | WO 02-067285 A3 | 8/2002 | |
| WO | WO 03-018862 A2 | 3/2003 | |
| WO | WO 03-018862 A3 | 3/2003 | |
| WO | WO 03-028081 A2 | 4/2003 | |
| WO | WO 03-095058 A2 | 11/2003 | |
| WO | WO 03-095089 A1 | 11/2003 | |
| WO | WO 03-095090 A1 | 11/2003 | |
| WO | WO 03-095130 A1 | 11/2003 | |
| WO | WO 03-095591 A1 | 11/2003 | |
| WO | WO 03-095699 A1 | 11/2003 | |
| WO | WO 03-095807 A1 | 11/2003 | |
| WO | WO 03-096369 A1 | 11/2003 | |
| WO | WO 03-096370 A1 | 11/2003 | |
| WO | WO 03-096380 A2 | 11/2003 | |
| WO | WO 03-096381 A2 | 11/2003 | |
| WO | WO 03-096382 A2 | 11/2003 | |
| WO | WO 03-096383 A2 | 11/2003 | |
| WO | WO 03-096747 A2 | 11/2003 | |
| WO | WO 03-096749 A1 | 11/2003 | |
| WO | WO 03-096766 A1 | 11/2003 | |
| WO | WO 03-096768 A1 | 11/2003 | |
| WO | WO 03-096770 A1 | 11/2003 | |
| WO | WO 03-096771 A1 | 11/2003 | |
| WO | WO 03-096772 A1 | 11/2003 | |
| WO | WO 03-096773 A1 | 11/2003 | |
| WO | WO 03-096774 A1 | 11/2003 | |
| WO | WO 2004-050939 A2 | 6/2004 | |

OTHER PUBLICATIONS

Agrawal et al., "Microwave Sintering of Commercial WC/Co Based Hard Metal Tools," Euro PM99, Sintering, Italy, 8 pages (1999).
Agrawal, D., "Microwave Processing of Ceramics," *Current Opinion in Solid State and Material Science*, 3:480-485 (1998).
Air Liquide, Heat Treatment—Gas Quenching,—http://www.airliquide.com/en/business/industry/_metals/applications/heat_treatment/quenching, 1 page (2000).
Alexander et al., "Electrically Conducive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html , 2 pages (Sep. 2002).
Anklekar et al., Microwave Sintering And Mechanical Properties of PM Copper Steel, pp. 355-362 (2001).
Batanov et al., "Plasmachemical Deposition of Thin Films in a Localized Free-Space Microwave Discharge," *Technical Physics*, 38:6, pp. 475-479 (1993).
Cheng et al., "Microwave Processing of WC-Co Composites And Ferroic Titanates" (Original Article), *Mat Res Innovat* (1):44-52 (1997).
Cheng, J., "Fabricating Transparent Ceramics by Microwave Sintering," *Focus on Electronics*, 79:9, pp. 71-74 (2000).

Collin, *Foundations for Microwave Engineering*, 2d Ed., IEEE Press, NY, pp. 180-192.
Egashira,. "Decomposition of Trichloroethylene by Microwave-induced Plasma Generated from SiC whiskers," *J. Electrochem. Soc.*, 145:1, pp. 229-235 (Jan. 1998).
Fraunhofer ILT, "Plasma-Reactors for Aftertreatment of Automobile Exhaust Gas," Fraunhofer-Gesellschaft (2002)—http://www.ilt.fhg.de/eng/jb01-s35.html, 1 page.
Gao et al., "Superfast Densification of Oxide/Oxide Ceramic Composites," *J. Am. Ceram. Soc.* 82[4]1061-63 (1999)—http://216.239.39.100/search?q=cache:b-TFhQlnU6YC:www.umr.edu/ ~hruiz/GaoShen.ppt+spark+plasma.
Gedevanishvili et al., "Microwave Combustion Synthesis And Sintering of Intermetallics And Alloys," *Journal of Materials Science Letters*, (18), pp. 665-668 (1999).
General Eastern, Semiconductor Manufacturing—Using the HygroTwin 2850 to Reduce Costs, Improve Quality, TIM 003, 3 pages, (1997).
George, S.J., "The Catalytic Converter," 5 pages, (2002)—http://krioma.net/Articles/Catalytic%20Converter/Catalytic%20Converter.html.
GlassTesseract.Org—The Home of Kenz Benz, "Tech Procedures and Tips: Exhaust Manifolds and Catalytic Converters Removal—and Installation", 4 pages (2003)—http://glasstesseract.org/tech/catalytic.html.
Holt Walton & Hill, Heat Treatment of Steels—The Processes, Azom.com, 9 pages, (2002).
Holt Walton & Hill, Powder Metallurgy—Overview of the Powder Metallurgy Process, Azom.com, 3 pages (2002)—http://www.azom.com/details.asp?ArticleID=1414.
Honda Automobile News Press Release, "Honda Introduces Its First Two Clean Air Vehicles, the Civic Ferio LEV and Partners 1.6 LEV", 3 pages (Feb. 1997)—http://world.honda.com/news/1997/4970217a.html.
Hsu et al., "Palladium-Coated Kieselguhr for Simultaneous Separation and Storage of Hydrogen," Westinghouse Savannah River Company, U.S. Dept. of Commerce, National Technical Information Service, 14 pages (2001).
Hydrogen Separation Membrane,—Advanced Gas Separation: H2 Separation, 1 page (2001).
Kalyanaraman et al., "Synthesis and Consolidation of Iron Nanopowders," *NanoStructured Materilas*, vol. 10, No. 8, pp. 1379-1392 (1998).
Karger, Odo—Area of Work: Microwave Welding, 2 pages (Nov. 2002).
Kong et al., "Nuclear-Energy-Assisted Plasma Technology for Producing Hydrogen," Nuclear Energy Research Initiative, 4 pages (2002).
Lewis, R. J. Sr., "Hawley's Condensed Chemical Dictionary," 12th ed., p. 230-232 (1993).
Microelectronics Plasma Applications,—March Plasma Systems, 2 pages (2002)—http://www.marchplasma.com/micro_app.htm.
Microwave Joining of Alumina and Zirconia Ceramics, IRIS, Research Topics 1998, 1 page.
Microwave Welding of Plastics, TWI World Centre for Materials Joining Technology, 2 pages, (Aug. 2002)—http://www.twi.co.uk/j32k/protected/band_3/ksab001.htm.
Microwave Welding, Welding and Joining Information Network, 3 pages (Nov. 2002)—http://www.ewi.org/technologies/plastics/microwave.asp.
Office of Energy Efficiency, "Using Non-Thermal Plasma Reactor to Reduce NOx Emissions from CIDI Engines," 1 page (Apr. 1999).
Optoelectronic Packaging Applications, March Plasma Systems, 2 pages (2002)—http://www.marchplasma.com/opto_app.htm.
Peelamedu et al., "Anisothermal Reaction Synthesis of Garnets, Ferrites, And Spinels In Microwave Field," *Materials Research Bulletin* (36):2723-2739 (2001).
PerfectH2TM PE8000 Series, "Palladium Diffusion Hydrogen Purifier For High Flow Rate MOCVD Applications" Matheson Tri.Gas, 2 pages (2002).
Photonics Dictionary, "Definition for Word(s): Thyratron" (Laurin Publishing), 2 pages (1996-2003)—http://www.photonics.com/dictionary/lookup/lookup.asp?url=lookup&entrynum=538.

Plasma Applications, Coalition for Plasma Science, 2 pages (1999, 2000)—http://www.plasmacoalition.org/applications.htm.
Plasma Electronics, Classical Plasma Applications, 2 pages (2002)—http://www.plasma.iinpe.br/English/Classical_Applications.htm.
Plasma-Assisted Catalyst Systems, Novel Plasma Catalysts Significantly Reduce NOx from Diesel Engines, 2 pages (Apr. 2001)—http://www.ott.doe.gov/success.html (2 pages).
Printed Circuit Board (PCB) Plasma Applications, March Plasma Systems, 2 pages (2002)—http://www.marchplasma.com/pcb_app.01.htm.
Roy et al., "Full Sintering of Powdered-Metal Bodies In A Microwave Field," *Nature*, vol. 399, pp. 668-670 (Jun. 17, 1999).
Roy et al., "Microwave Processing: Triumph of Applications-Driven Science in WC-Composites And Ferroic Titanates," *Ceramic Transactions*, vol. 80, pp. 3-26, (1997).
Roy et al., "Definitive Experimental Evidence for Microwave Effects: Radically New Effects of Separated E and H Fields, Such As Decrystallization of Oxides in Seconds," *Materials Research Innovations*, Springer-Verlag, vol. 6, No. 3, pp. 129-140 (2002).
Roy et al., "Major phase transformations and magnetic property changescaused by electromagnetic fields at microwave frequencies," *Journal Of Material Research*, 17:12, pp. 3008-3011 (2002).
Samant et al., "Glow Discharge Nitriding Al 6063 Samples and Study of Their Surface Hardness," Metallofizika I Noveishe Takhnologii, 23(3), pp. 325-333 (2001).
Sato et al., Surface Modification of Pure Iron by RF Plasma Nitriding with DC Bias Voltage Impression, *Hyomen Gijutsu* 48(3), pp. 317-323 (1997) (English Abstract).
Saveliev Y. "Effect of Cathode End Caps and a Cathode Emissive Surface on Relativistic Magnetron Opeartion," *IEEE Transactions on Plasma Science*, 28:3, pp. 478-484 (Jun. 2000).
SC/Tetra Engine Manifold Application, 2 pages (2001)—http://www.sctetra.com/applications/01_manifold.htm.
Shulman et al., "Microwaves In High-Temperature Processes," GrafTech, 8 pages (Mar. 2003) http://www.industrialheating.com/CDA/ArticleInformation/features/BNP_Features_Item/0,2832,94035,00.html.
Slone et al., "Nox Reduction For Lean Exhaust Using Plasma Assisted Catalysis," NOXTECH Inc., 5 pages (2000)—http://www.osti.gov/fcvt/deer2000/bhattpa.pdf.
Sumitomo Heavy Industries, Ltd., "Spark Plasma Sintering—What is Spark Plasma Sintering," 3 pages (2001)—http://www.shi.co.jp/sps/eng/.
Takizawa et al. "Synthesis of inorganic materials by 28 GHz MW radiation," Proceed. Of The Symposium On Mw Effects And Applications, Aug. 2, 2001, Kokushikau Univ., Tokyo, Japan, pp. 52-53, (2001).
Taube et al. "Advances in Design of Microwave Resonance Plasma Source," American Institute of Chemical Engineering, 2004 Annual Meeting, Presentation (Nov. 2004).
Uchikawa et al., "New Technique of Activating Palladium Surface for Absorption of Hydrogen or Deuterium," *Japanese Journal of Applied Physics*, vol. 32 (1993), pp. 5095-5096, Part 1, No. 11A (Nov. 1993).
Wang et al., "Densification of Al2O3 Powder Using Spark Plasma Sintering," *J. Mater. Res.*, 15:4, pp. 982-987 (Apr. 2000).
Way et al., "Palladium/Copper Allow Composite Membranes for High Temperature Hydrogen Separation from Coal-Derived Gas Streams," Dept. of Chemical Engineering, Colorado School of Mines, 3 pages (1999).
Welding Breakthrough: Generating and Handling a Microwave Powered Plasma, Australian Industry News, Information & Suppliers, 7 pages (Sep. 2001)—http://www.industry/search.com.au/features/microwave.asp.
Welding Plastic Parts, Business New Publishing Company, 4 pages (Nov. 2002)—http://www.assemblymag.com/Common/print_article.asp?rID=E455512C17534C31B96D.
Xie et al., "Effect of Rare Earth in Steel on Thermochemical Treatment," Xiuou Jinshu Cailiao Yu Gongcheng, 26(1), pp. 52-55 (Feb. 1997) (English Abstract).
Yahoo Canada—Autos, "Catalytic Converter Answer2," 4 pages (2001)—http://ca.autos.yahoo.com/maintain/catalytic_converteranswer2.html.
International Search Report issued on Jun. 26, 2003, in PCT/US03/14037.
International Search Report issued on Jul. 8, 2003, in PCT/US03/14124.
International Search Report issued on Jun. 24, 2003, in PCT/US03/14132.
International Search Report issued on Jul. 29, 2003, in PCT/US03/14052.
International Search Report issued on Jul. 29, 2003, in PCT/US03/14054.
International Search Report issued on Apr. 27, 2004, in PCT/US03/14036.
International Search Report issued on Aug. 21, 2003, in PCT/US03/14053.
International Search Report issued on Feb. 8, 2004, in PCT/US03/14034.
International Search Report issued on Aug. 29, 2003, in PCT/US03/14039.
International Search Report issued on Aug. 21, 2003, in PCT/US03/14038.
International Search Report issued on Aug. 24, 2003, in PCT/US03/14133.
International Search Report issued on Jul. 28, 2003, in PCT/US03/14035.
International Search Report issued on Jun. 27, 2003, in PCT/US03/14040.
International Search Report issued on Jul. 17, 2003, in PCT/US03/14134.
International Search Report issued on Jun. 27, 2003, in PCT/US03/14122.
International Search Report issued on Jun. 24, 2003, in PCT/US03/14130.
International Search Report issued on Apr. 30, 2004, in PCT/US03/14055.
International Search Report issued on Apr. 30, 2004, in PCT/US03/140137.
International Search Report issued on Aug. 21, 2003, in PCT/US03/14123.
International Search Report issued on Jul. 29, 2003, in PCT/US03/14121.
International Search Report issued on Aug. 24, 2003, in PCT/US03/14136.
International Search Report issued on May 3, 2004, in PCT/US03/14135.
Written Opinion issued on Apr. 13, 2004, in PCT/US03/014037.
Examination Report issued on Feb. 24, 2004, in PCT/US03/14054.
Written Opinion issued on Dec. 22, 2003, in PCT/US03/14053.
Examination Report issued on Apr. 26, 2004, in PCT/US03/14053.
Written Opinion issued on Dec. 22, 2003, in PCT/US03/14123.
Examination Report issued on Apr. 26, 2004, in PCT/US03/14123.
Quayle Action issued on Apr. 19, 2005, in U.S. Appl. No. 10/449,600.
Quayle Action issued on Apr. 19, 2004, in U.S. Appl. No. 10/430,414.
Office Action issued on May 18, 2004, in U.S. Appl. No. 10/430,426.
Reply to Office Action filed on Nov. 18, 2004, in U.S. Appl. No. 10/430,426.
Office Action issued on Feb. 24, 2005, in U.S. Appl. No. 10/430,426.
Accentus Corporate Overview, 3 pages—http://www.accentus.co.uk/ipco/html/techenv6_txt_fr.html (2003).
Agrawal et al., "Grain Growth Control in Microwave Sintering of Ultrafine WC-Co Composite Powder Compacts," Euro PM99 Conference, Sintering, Turino, Italy, 8 pages (1999).
Agrawal, "Metal Parts from Microwaves," *Materials World* 7(11):672-673 (1999).
Agrawal, "Microwave Processing of Ceramics," *Current Opinion in Solid State and Materials Science* 3:480-485 (Oct. 1998).
Air Liquide, "Heat Treatment—Gas Quenching,"—http://www.airliquide.com/en/business/industry/metals/applications/heat_treatment/quenching.asp, 1 page (2000).
Alexander et al., "Electrically Conductive Polymer Nanocomposite Materials," AFRL's Materials and Manufacturing Directorate, Nonmetallic Materials Division, Polymer Branch, Wright-Patterson AFB OH—http://www.afrlhorizons.com/Briefs/Sept02/ML0206.html , 2 pages (Sep. 2002).

Al-Shamma'a et al., "Microwave Atmospheric Plasma for Cleaning Exhaust Gases and Particulates," Future Car Congress, Washington, Jun. 3-5, 2002 (1 page).

Alton et al., "A High-Density, RF Plasma-Sputter Negative Ion Source," The $8^{th}$ Intl. Conf. on Heavy-Ion Accelerator Technology, Argonne Natl. Lab., Oct. 5-9, 1998, Poster Presentation (3 pages).

Anklekar et al., "Microwave Sintering and Mechanical Properties of PM Copper Steel," *Powder Metallurgy* 44(4):355-362 (2001).

Batanov et al., "Plasmachemical Deposition of Thin Films in a Localized Free-Space Microwave Discharge," *Technical Physics* 38(6):475-479 (Jun. 1993).

Cheng, J., "Fabricating Transparent Ceramics by Microwave Sintering," *Am. Ceramic Soc. Bull.* 79(9):71-74 (2000).

Cheng et al., "Microwave Processing of WC-Co Composites And Ferroic Titanates" *Mat. Res. Innovat.* 1(1):44-52 (Jun. 1997).

"Classification of Cast Iron"—Key to Steel—Article—http://www.key-to-steel.com/Articles/Art63.htm, 3 pages (1999).

Collin, in: *Foundations for Microwave Engineering*, 2d Ed., IEEE Press, NY, pp. 180-192 (2001).

"Controlled Atmospheres Sinter-Hardening,," Sarnes Ingenieure, 2 pages, http://www.space-ctrl.de/de/2002/06/399.php (2002).

Egashira et al., "Decomposition of Trichloroethylene by Microwave-Induced Plasma Generated from SiC Whiskers," *J. Electrochem. Soc.*, 145(1):229-235 (Jan. 1998).

Fraunhofer ILT, "Plasma-Reactors for Aftertreatment of Automobile Exhaust Gas," Fraunhofer-Gesellschaft—http://www.ilt.fhg.de/eng/jb01-s35.html, 1 page (2002).

French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.

Gao et al., "Superfast Densification of Oxide/Oxide Ceramic Composites," *J. Am. Ceram. Soc.* 82(4)1061-1063 (1999).

Gedevanishvili et al., "Microwave Combustion Synthesis And Sintering of Intermetallics and Alloys," *J. Mat. Sci. Lett.* 18(9):665-668 (1999).

General Eastern, "Semiconductor Manufacturing—Using the HygroTwin 2850 to Reduce Costs, Improve Quality,", 3 pages, www.generaleastern.net (1997).

George, "The Catalytic Converter," 5 pages, (2002)—http://krioma.net/articles/Catalytic%20Converter/Catalytic%20Converter.htm.

GlassTesseract.Org website, "Tech Procedures and Tips: Exhaust Manifolds and Catalytic Converters Removal—and Installation", 4 pages (2003). http://glasstesseract.org/tech/catalytic.html.

*Hackh's Chemical Dictionary*, 3rd edition, J. Grant, Ed., McGraw Hill Book Co., NY, pp. 174-175 (1944).

"Heat Treatment of Steels—The Processes," AZoM.com, 9 pages, (2002)—www.azom.com.

"Powder Metallurgy—Overview of the Powder Metallurgy Process," AZoM.com, 3 pages (2002)—http://www.azom.com/details.asp?ArticleID=1414.

Fincke, "Hydrogen Separation Membrane,—Advanced Gas Separation: H2 Separation," Summary of research proposal, 1 page (2003).

Saville, in: *Iron and Steel*, Chapter 6, pp. 16-22, Wayland Publ., England (1976).

Kalyanaraman et al., "Synthesis and Consolidation of Iron Nanopowders," *NanoStructured Materials* 10(8):1379-1392 (1998).

Karger, Scientific Staff Research Areas for KTP Company, 2 pages (Nov. 2002)—http://wwwfb10.upb.de/KTP/KTP-ENG/Staff/Karger/body_karger.html.

Kong et al., "Nuclear-Energy-Assisted Plasma Technology for Producing Hydrogen," Nuclear Energy Research Initiative Research Proposal, 4 pages (2002).

Lewis, in: *Hawley's Condensed Chemical Dictionary*, 12th ed., pp. 230-232, Van Nostrand Reinhold, NY (1993).

Ahmed et al., "Microwave Joining of Alumina and Zirconia Ceramics," IRIS Research Topics 1998, 1 page (1988).

"Microwave Welding," EWi WeldNet, 1 page—(2003) http://www.ferris.edu/cot/accounts/plastics/ htdocs/Prey/Microwave%20Homepage.htm.

"Microwave Welding of Plastics," TWI World Centre for Materials Joining Technology, 2 pages, (Aug. 2002)—http://www.twi.co.uk/j32k/protected/band_3/ksab001.htm.

"Microwave Welding," Welding and Joining Information Network, 3 pages (Nov. 2002)—http://www.ewi.org/technologies/plastics/microwave.asp.

Thomas et al., "Non-Thermal Plasma Aftertreatment of Particulates—Theoretical Limits and Impact on Reactor Design," SAE Spring Fuels and Lubes Conference, Paris, France, 27 pages—Jun. 19-22, 2000—http://www.aeat.co.uk/electrocat/sae/saepaper.htm.

"Using Non-Thermal Plasma Reactor to Reduce NOx Emissions from CIDI Engines," Office of Energy Efficiency and Renewable Energy, Office of Transportation, 1 page (Apr. 1999).

"Optoelectronic Packaging Applications," March Plasma Systems, Product Description, 2 pages (2002)—http://www.marchplasma.com/opto_app.htm.

Paglieri et al., "Palladium Alloy Composite Membranes for Hydrogen Separation," $15^{th}$ Annual Conf. Fossil Energy Matter, Knoxville, TN (2001), 5 pages.

Peelamedu et al., "Anisothermal Reaction Synthesis of Garnets, Ferrites, and Spinels In Microwave Field," *Materials Research Bulletin* 36:2723-2739 (Dec. 2001).

PerfectH2 PE8000 Series Product Description, Palladium Diffusion Hydrogen Purifier For High Flow Rate MOCVD Applications, Matheson Tri.Gas, 2 pages (2002).

"Plasma Applications," Coalition for Plasma Science, 2 pages (1999, 2000)—http://www.plasmacoalition.org/applications.htm.

"Classical Plasma Applications," 2 pages (2002)—http://www.plasma.iinpe.br/English/Classical_Applications.htm.

"Novel Plasma Catalysts Significantly Reduce NOx from Diesel Engines," US Department of Energy research summary, 2 pages (Apr. 2001)—http://www.ott.doe.gov/success.html.

"Printed Circuit Board (PCB) Plasma Applications," March Plasma Systems product descriptions, 2 pages (2002)—http://www.marchplasma.com/pcb_app.01.htm.

Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).

Roy et al., "Full Sintering of Powdered-Metal Bodies in a Microwave Field," Nature 399:668-670 (Jun. 17, 1999).

Roy et al., "Major phase transformations and magnetic property changes caused by electromagnetic fields at microwave frequencies," *J. Mat. Res.* 17(12):3008-3011 (2002).

Roy et al., "Microwave Processing: Triumph of Applications-Driven Science in WC-Composites And Ferroic Titanates," *Ceramic Transactions* 80:3-26, (1997).

Samant et al., "Glow Discharge Plasma Nitriding of Al 6063 Samples and Study of Their Surface Hardness," *Metallofiz. Noveishe Tekhnol* 23(3):325-333 (2001).

Sato et al., "Surface Modification of Pure Iron by rf Plasma Nitriding with dc Bias Voltage Impression," *Hyomen Gijutsu* 48(3):317-323 (1997) (English Abstract).

Saveliev et al., "Effect of Cathode End Caps and a Cathode Emissive Surface on Relativistic Magnetron Operation," *IEEE Transactions on Plasma Science* 28:3.478-484 (Jun. 2000).

Shulman, "Microwaves In High-Temperature Processes," GrafTech Intl. Ltd., 8 pages (Mar. 2003) http://www.industrialheating.com/CDA/ArticleInformation/features/BNP_Features_Item/0,2832,94035,00.html.

Sumitomo Heavy Industries, Ltd., "Spark Plasma Sintering," 3 pages (2001)—http://www.shi.co.jp/sps/eng/.

Takizawa et al. "Synthesis of inorganic materials by 28 GHz Microwave Irradiation," *Transactions of the Materials Research Society of Japan* 27(1):51-54 (2002).

Taube et al., "Advances in Design of Microwave Resonance Plasma Source," American Institute of Chemical Engineering, 2004 Annual Meeting, Presentation (Nov. 2004).

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

"Welding Plastic Parts," Business New Publishing Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1):52-55 (Feb. 1997) (English Abstract).

International Search Report issued on Jul. 23, 2003, in PCT/US03/14037.

International Search Report issued on Aug. 15, 2003, in PCT/US03/14124.

International Search Report issued on Sep. 10, 2003, in PCT/US03/14132.

International Search Report issued on Aug. 14, 2003, in PCT/US03/14052.

International Search Report issued on Aug. 14, 2003, in PCT/US03/14054.

International Search Report issued on May 10, 2004, in PCT/US03/14036.

International Search Report issued on Aug. 9, 2003, in PCT/US03/14053.

International Search Report issued on Feb. 25, 2004, in PCT/US03/14034.

International Search Report issued on Sep. 19, 2003, in PCT/US03/14039.

International Search Report issued on Aug. 29, 2003, in PCT/US03/14038.

International Search Report issued on Dec. 30, 2003, in PCT/US03/14133.

International Search Report issued on Aug. 28, 2003, in PCT/US03/14035.

International Search Report issued on Jul. 29, 2003, in PCT/US03/14040.

International Search Report issued on Sep. 10, 2003, in PCT/US03/14134.

International Search Report issued on Aug. 29, 2003, in PCT/US03/14122.

International Search Report issued on Sep. 30, 2003, in PCT/US03/14130.

International Search Report issued on May 24, 2004, in PCT/US03/14055.

International Search Report issued on May 26, 2004, in PCT/US03/14137.

International Search Report issued on Aug. 29, 2003, in PCT/US03/14123.

International Search Report issued on Aug. 29, 2003, in PCT/US03/14121.

International Search Report issued on Sep. 16, 2003, in PCT/US03/14136.

International Search Report issued on May 25, 2004, in PCT/US03/14135.

Willert-Porada, M., "Alternative Sintering Methods" 1 page Abstract dated Nov. 8, 2001, http://www.itap.physik.uni-stuttgart.de/~gkig/neu/english/welcome.php?/~gkig/neu/abstracts/abstract_willert-porada.html.

* cited by examiner

PLASMA-ASSISTED HEAT TREATMENT

CROSS-REFERENCE TO RELATED APPLICATIONS

Priority is claimed to U.S. Provisional Patent Application No. 60/378,693, filed May 8, 2002, 60/430,677, filed Dec. 4, 2002, and No. 60/435,278, filed Dec. 23, 2002, all of which are fully incorporated herein by reference.

FIELD OF THE INVENTION

This invention relates to heat treatment systems and methods. More specifically, the invention relates to systems and methods for igniting, modulating, and sustaining plasmas in gases using electromagnetic radiation in the presence of plasma catalysts and for using the plasmas in heat treatment processes.

BACKGROUND

Various heat treatments (e.g., hardening, annealing, normalizing, spheroidizing, tempering, etc.) are known. These processes can involve operations, or combinations of operations, involving the heating and cooling of a metal or an alloy in the solid state, for the purpose of obtaining certain desirable conditions or properties. Heat treatments, therefore, may be useful for generating a material having properties especially suited for use in a particular part, structure, or application.

In most heat treatment processes, for example, the desired material properties of a component are controlled/obtained by controlling the temperature of the component, the rate of change of temperature of the component, and the amount of time that the component spends at a certain temperature or within a range of temperatures. Adjusting the parameters of a heat treatment may result in a change in material properties including, for example, hardness, grain size, toughness, crystal structure, ductility, elasticity, density, optical reflectivity, electrical conductivity, thermal conductivity, electron mobility, magnetic susceptibility, carbon content, and porosity.

While known heat treatment methods may achieve acceptable results, some of these methods include several disadvantages. For example, some known methods employ traditional furnaces for heating the materials to be treated. Using these furnaces, it may difficult to precisely control the temperature of the material. For example, for a particular rate of increase in temperature within the furnace, there may be a corresponding lag in the temperature of the material. This lag may be significant, and in certain heat treatment processes, not all of the material to be treated may achieve a desired processing temperature or satisfy a desired time-temperature profile. This can lead to formation of undesirable phases within the material or to degraded material properties.

Further, some traditional heat treatment methods using conventional furnaces may not be suited for heat treating objects with non-standard profiles or shapes. For example, in conventional systems, any sharp corners or small fillets on a part to be heat treated may produce large stress concentrations during the heat treatment process. As a result of these large stress concentrations, the part may experience cracking or some other type of damage during heat treatment. Also, conventional heat treatment systems may not be suitable for treating unusually shaped parts having reentrant features, multiple different thicknesses, or variable cross sections.

The present invention can solve one or more of the problems associated with known heat treatments.

SUMMARY OF THE INVENTION

One aspect of the invention provides a plasma-assisted method of heat treating an object. The method can include initiating a heat treating plasma by subjecting a gas to electromagnet radiation having a frequency of less than about 333 GHz (e.g., microwave radiation) in the presence of a plasma catalyst, and heating the object by exposing the object to the plasma. Exposure of the object to the plasma may be maintained for a first period of time sufficient to alter at least one material property of the object.

Another aspect of the invention provides a system for plasma-assisted heat treating of an object. The system can include a plasma catalyst, a vessel in which a cavity is formed and in which a plasma can be initiated by subjecting a gas to radiation in the presence of the plasma catalyst, a radiation source connected to the cavity for supplying radiation into the cavity, a gas inlet arranged on the vessel for connection to a gas source for providing a gas, a detector for monitoring a temperature associated with the object, and a controller that adjusts a power level of the radiation source based on the time or temperature.

A number of plasma catalysts are also provided for plasma-assisted heat treating consistent with this invention.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE INVENTION

Methods and apparatus for plasma-assisted heat treatment can be provided consistent with this invention. The plasmas can be ignited, as well as modulated and sustained, with a plasma catalyst consistent with this invention.

The following commonly owned U.S. patent applications are hereby incorporated by reference in their entireties: U.S. patent application Ser. No. 10/513,221 (filed from PCT Application No. PCT/US03/14037), U.S. Application Ser. No. 10/513,393 (filed from PCT Application No. PCT/US03/14124), PCT Application No. PCT/US03/14132, U.S. Application Ser. No. 10/513,394 (filed from PCT Application No. PCT/US03/14052), U.S. Application Ser. No. 10/513,305 , U.S. Application Ser. No. 10/513,607(filed from PCT Application No. PCT/US03/14036), U.S. Patent No. 6,870,124, PCT Application No. PCT/US03/14034, U.S. Application Ser. No. 10/430,416 (PCT Application No. PCT/US03/14039), U.S. Application Ser. No. 10/430,415 (PCT Application No. PCT/US03/14038), PCT Application No. PCT/US03/14133, U.S. Application Ser. No. 10/513,606 (filed from PCT Application No. PCT/US03/14035), U.S. Application Ser. No. 10/513,309 (filed from PCT Application No. PCT/US03/14040), U.S. Application Ser. No. 10/413,220 (filed from PCT Application No. PCT/US03/14134), PCT Application No. PCT/US03/14122, U.S. Application Ser. No. 10/513,397 (filed from PCT Application No. PCT/US03/14130), U.S. Application No. 10/513,605 (filed from PCT Application No. PCT/US03/14055), PCT Application No. PCT/US03/14137, U.S. Application Ser. No. 10/430,426 (PCT Application No. PCT/US03/14123), PCT Application No. PCT/US03/14121, and PCT Application No. PCT/US03/14135.

Illustrative Plasma System

Figure 1:
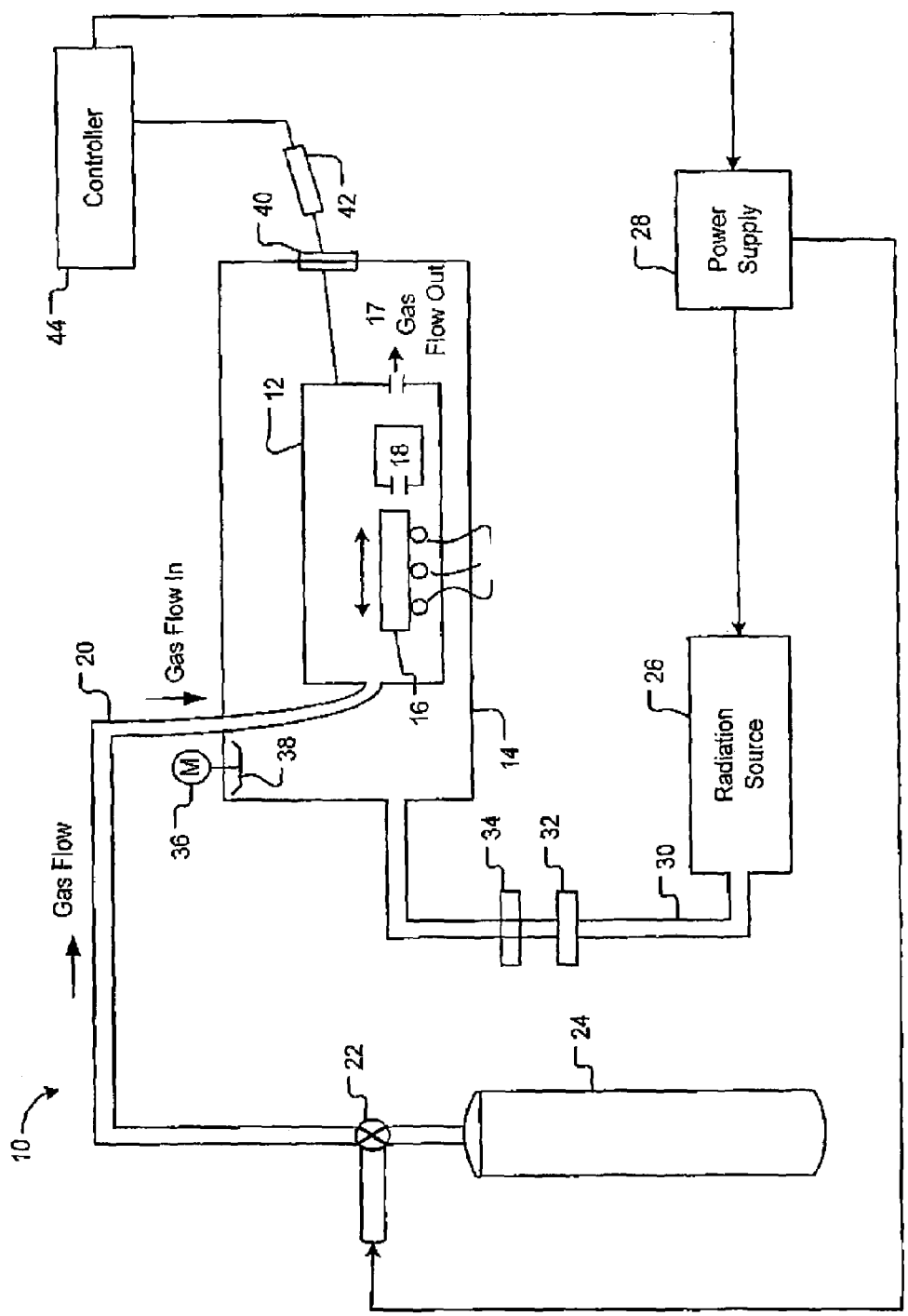
FIG. 1 shows a schematic diagram of an illustrative plasma-assisted heat treating system consistent with this invention.
Figure 12:
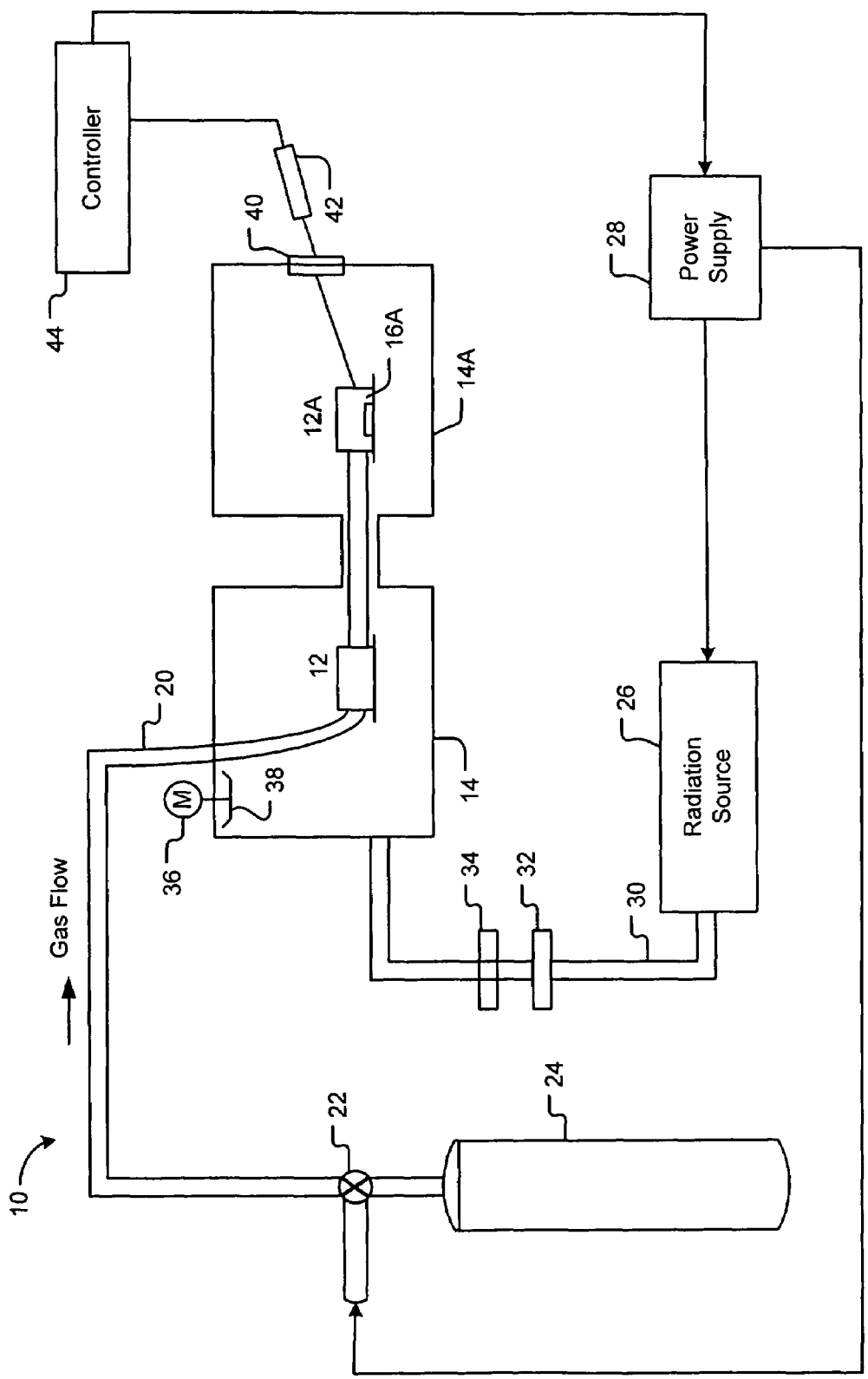
FIG. 12 shows a schematic diagram of an illustrative plasma-assisted heat treating system having first and second cavities consistent with this invention.

FIG. 1 illustrates an exemplary heat treatment system 10 consistent with one aspect of this invention. In this embodiment, cavity 12 is formed in a vessel that is positioned inside radiation chamber (i.e., applicator) 14. In another embodiment not shown), vessel 12 and radiation chamber 14 are the same, thereby eliminating the need for two separate components. In still another embodiment as shown in FIG. 12, a second vessel 14A includes a second cavity 12A. The vessel in which cavity 12 is formed can include one or more radiation-transmissive (e.g., microwave-transmissive) insulating layers to improve its thermal insulation properties without significantly shielding cavity 12 from the radiation.

In one embodiment, cavity 12 is formed in a vessel made of ceramic. Due to the extremely high temperatures that can be achieved with plasmas consistent with this invention, a ceramic capable of operating at a temperature greater than about 2,000 degrees Fahrenheit such as about 3,000 degrees Fahrenheit, can be used. The ceramic material can include, by weight, 29.8% silica, 68.2% alumina, 0.4% ferric oxide, 1% titania, 0.1% lime, 0.1% magnesia, 0.4% alkalies, which is sold under Model No. LW-30 by New Castle Refractories Company, of New Castle, Pa. It will be appreciated by those of ordinary skill in the art, however, that other materials, such as quartz, and those different from the one described above, can also be used consistent with the invention. It will be appreciated that other embodiments of the invention may include materials intended to operate at temperatures below about 2,000 degrees Fahrenheit.

In one successful experiment, a plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing a gas from which the plasma can be formed. The size and shape of the cavity can depend on the heat treatment process being performed. Also, the cavity may be configured to discourage or prevent the plasma from rising/floating away from the primary processing region.

Cavity 12 can be connected to one or more gas sources 24 (e.g., a source of argon, nitrogen, hydrogen, xenon, krypton) by line 20 and control valve 22, which may be powered by power supply 28. In certain embodiments, a plasma is formed from one or more gases supplied by gas source 24. Line 20 may be any channel capable of conveying the gas but can be narrow enough to prevent significant radiation leakage. For example, line 20 may be tubing (e.g., having a diameter between about 1/16 inch and about 1/4 inch, such as about 1/8"). Also, if desired, a vacuum pump can be connected to the chamber to remove any undesirable fumes, via gas flow out 17 as appreciated by a person having an ordinary skill in the art, that may be generated during plasma processing.

A radiation leak detector (not shown) was installed near source 26 and waveguide 30 and connected to a safety interlock system to automatically turn off the radiation (e.g., microwave) power supply if a leak above a predefined safety limit, such as one specified by the FCC and/or OSHA (e.g., 5 mW/cm$^2$), was detected.

Radiation source 26, which may be powered by electrical power supply 28, can direct radiation energy into chamber 14 through one or more waveguides 30. It will be appreciated by those of ordinary skill in the art that source 26 can be connected directly to chamber 14 or cavity 12, thereby eliminating waveguide 30. The radiation energy entering cavity 12 can be used to ignite a plasma within the cavity. This plasma can be substantially sustained and confined to the cavity by coupling additional radiation, such as microwave radiation, with the catalyst.

Radiation energy can be supplied through circulator 32 and tuner 34 (e.g., 3-stub tuner). Tuner 34 can be used to minimize the reflected power as a function of changing ignition or processing conditions, especially before the plasma has formed because microwave power, for example, will be strongly absorbed by the plasma.

As explained more fully below, the location of radiation-transmissive cavity 12 in chamber 14 may not be critical if chamber 14 supports multiple modes, and especially when the modes are continually or periodically mixed. For example, motor 36 can be connected to mode-mixer 38 for making the time-averaged radiation energy distribution substantially uniform throughout chamber 14. Furthermore, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer has a voltage output that can vary with temperature to within a certain tracking range.

Sensor 42 can develop output signals as a function of the temperature or any other monitorable condition associated with a work piece (not shown) within cavity 12 and provide the signals to controller 44. Dual temperature sensing and heating, as well as automated cooling rate and gas flow controls can also be used. Controller 44 in turn can be used to control operation of power supply 28, which can have one output connected to radiation source 26 as described above and another output connected to valve 22 to control gas flow into radiation cavity 12.

The invention has been practiced with equal success employing microwave sources at both 915 MHz and 2.45 GHz provided by Communications and Power Industries (CPI), although radiation having any frequency less than about 333 GHz can be used. The 2.45 GHz system provided continuously variable microwave power from about 0.5 kilowatts to about 5.0 kilowatts. A 3-stub tuner allowed impedance matching for maximum power transfer and a dual directional coupler (not shown in FIG. 1) was used to measure forward and reflected powers.

As mentioned above, radiation having any frequency less than about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment was computer controlled using LabView 6i software, which provided real-time temperature monitoring and microwave power control. Noise was reduced by using shift registers to generate sliding averages of suitable number of data points. Also, the number of stored data points in the array were limited to improve speed and computational efficiency. The pyrometer measured the temperature of a sensitive area of about 1 cm$^2$, which was used to calculate an average temperature. The pyrometer sensed radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described, for example, in commonly owned, concurrently filed PCT Application No. PCT/US03/14135,which is hereby incorporated by reference in its entirety.

Chamber 14 may include several glass-covered viewing ports with microwave shields and a quartz window for pyrometer access. Several ports for connection to a vacuum pump and a gas source may also be provided, although not necessarily used.

System 10 may also include an optional closed-loop deionized water cooling system (not shown) with an external heat exchanger cooled by tap water. During operation, the deionized water may cool the magnetron, then the load-dump in the circulator (used to protect the magnetron), and finally the radiation chamber through water channels welded on the outer surface of the chamber.

Plasma Catalysts

A plasma catalyst consistent with this invention can include one or more different materials and may be either passive or active, the active catalyst included in an active catalyst source A plasma catalyst can be used, among other things, to ignite, modulate, and/or sustain a plasma at a gas pressure that is less than, equal to, or greater than atmospheric pressure.

One method of forming a plasma consistent with this invention can include subjecting a gas in a cavity to electromagnetic radiation having a frequency of less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can be, for example, a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst consistent with this invention can also be, for example, a powder and need not comprise nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily and uniformly consumed, if desired.

Figure 1A:
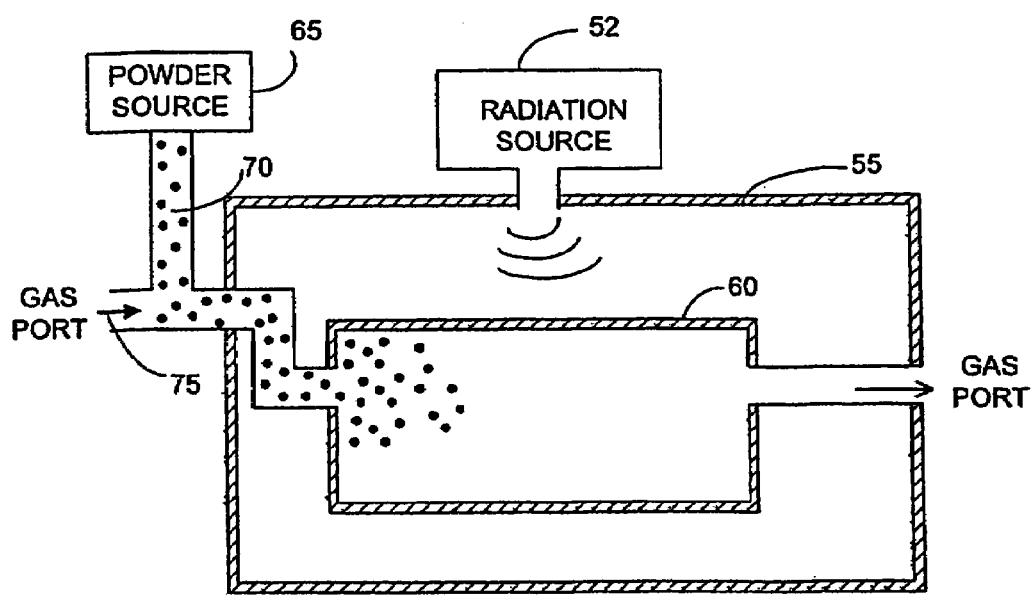
FIG. 1A shows an illustrative embodiment of a portion of a plasma-assisted heat treating plasma system for adding a powder plasma catalyst to a plasma cavity for igniting, modulating, or sustaining a plasma in a cavity consistent with this invention.

In one embodiment, the powder catalyst can be carried into the heat treatment cavity and at least temporarily suspended with a carrier gas. The carrier gas can be the same or different from the gas that forms the plasma. Also, the powder can be added to the gas prior to being introduced to the cavity. For example, as shown in FIG. 1A, radiation source 52 can supply radiation to cavity 55, which includes plasma cavity 60 (e.g., where heat treatment may occur). Powder source 65 can provide catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a plasma by moving, conveying, drizzling, sprinkling, blowing, or otherwise feeding the powder into or within the cavity.

In one experiment, a plasma was ignited in a cavity by placing a pile of carbon fiber powder in a copper pipe that extended into the cavity. Although sufficient radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the radiation, a plasma was nearly instantaneously ignited in the cavity at about atmospheric pressure.

A powder plasma catalyst consistent with this invention can be substantially non-combustible, thus it need not contain oxygen or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities, such as a first vessel 14 including a first as shown in FIG. 12. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions can be at least about 1:2, but can be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2-3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation, of Anderson, S.C. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above can include at least one material that is at least electrically semi-conductive. In one embodiment, the material can be highly conductive. For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, in doping semiconductors and other materials, one or more dopants can be added to the plasma through the catalyst. See, e.g., commonly owned, concurrently filed U.S. patent application Ser. No. 10/513,397, which is hereby incorporated by reference in its entirety. The catalyst can include the dopant itself, or it can include a precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while sustaining the plasma, the catalyst could include a relatively large percentage of additives. It will be appreciated by those of ordinary skill in the art that the component ratio of the plasma catalyst used to ignite and sustain the plasma could be the same.

In certain embodiments of the invention, a predetermined plasma catalyst ratio profile can be used. In some conventional plasma processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the ratio of components in a plasma can depend on the portions of the catalyst currently and/or previously consumed, especially when the flow rate of a gas passing through the plasma chamber is relatively slow.

Figure 2:
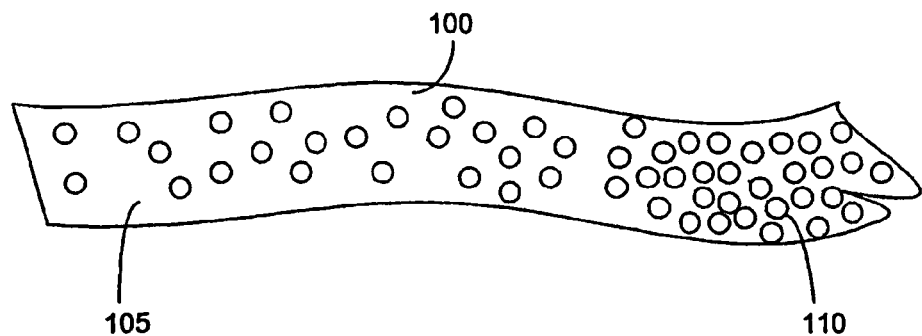
FIG. 2 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 2, the component ratio can vary smoothly forming a ratio gradient along the length of catalyst 100. Thus, catalyst 100 can include a strand of material that includes a relatively low concentration of one or more components at section 105 and a continuously increasing concentration toward section 110.

Figure 3:
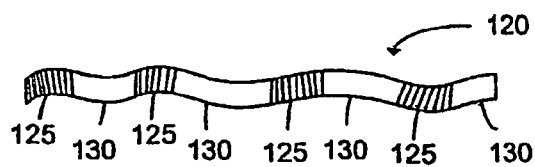
FIG. 3 shows an illustrative plasma catalyst fiber with multiple components at a ratio that varies along its length consistent with this invention.

Alternatively, as shown in FIG. 3, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining a plasma.

Figure 4:
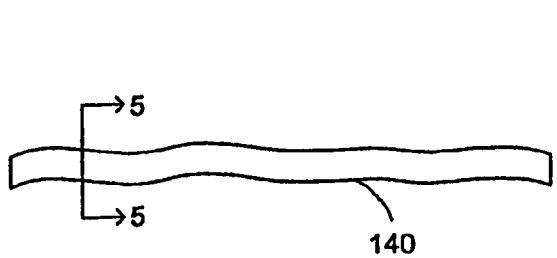
FIG. 4 shows another illustrative plasma catalyst fiber that includes a core under layer and a coating consistent with this invention.
Figure 5:
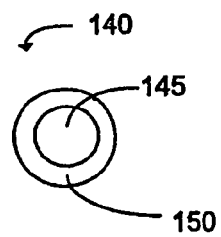
FIG. 5 shows a cross-sectional view of the plasma catalyst fiber of FIG. 4, taken from line 5-5 of FIG. 4, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 4 and 5, for example, show fiber 140, which includes under layer 145 and coating 150. In one embodiment, a plasma catalyst including a carbon core is coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within a radiation cavity to substantially reduce or prevent radiation energy leakage via the catalyst. In this way, the plasma catalyst does not electrically or magnetically couple with the vessel containing the cavity or to any electrically conductive object outside the cavity. This prevents sparking at the ignition port and prevents radiation from leaking outside the cavity during the ignition and possibly later if the plasma is sustained. In one embodiment, the catalyst can be located at a tip of a substantially electrically non-conductive extender that extends through an ignition port.

Figure 6:
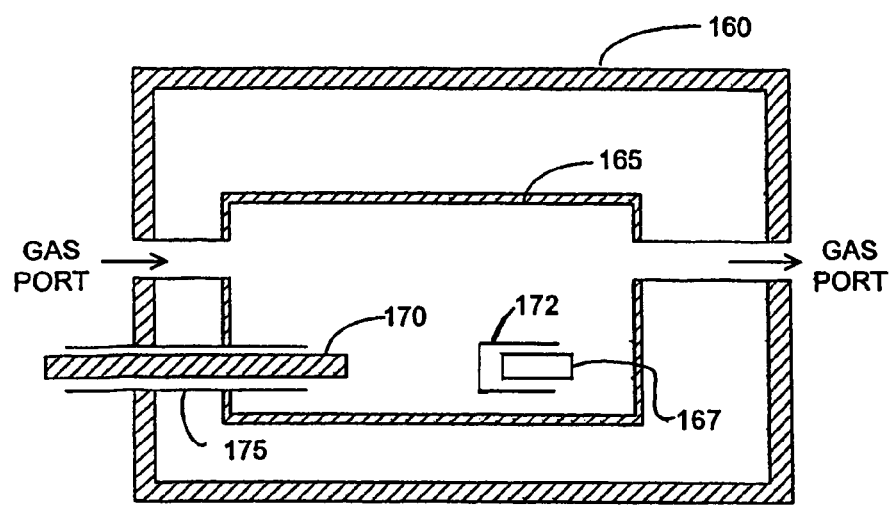
FIG. 6 shows an illustrative embodiment of another portion of a plasma system including an elongated plasma catalyst that extends through ignition port consistent with this invention.
Figure 7:
FIG. 7 shows an illustrative embodiment of an elongated plasma catalyst that can be used in the system of FIG. 6 consistent with this invention.

FIG. 6, for example, shows radiation chamber 160 in which plasma cavity 165 is placed. Plasma catalyst 170 can be elongated and can extend through ignition port 175. As shown in FIG. 7, and consistent with this invention, catalyst 170 can include electrically conductive distal portion 180 (which is placed in chamber 160 but can extend into chamber 160) and electrically non-conductive portion 185 (which is placed substantially outside chamber 160). This configuration prevents an electrical connection (e.g., sparking) between distal portion 180 and chamber 160.

Figure 8:
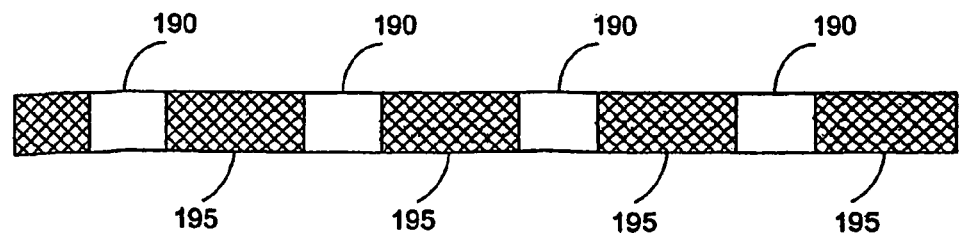
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

As an alternative to the passive plasma catalysts described above, active plasma catalysts can be used consistent with this invention. A method of forming a heat treatment plasma using an active catalyst consistent with this invention can include subjecting a gas in a cavity to electromagnetic radiation having a frequency less than about 333 GHz in the presence of the active plasma catalyst, which generates or includes at least one ionizing particle or ionizing radiation. It will be appreciated that both passive and active plasma catalysts can be used in the same heat treatment process.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing radiation and/or particles can be directed into the cavity in the form of a focused or collimated beam, or they may be sprayed, spewed, sputtered, or otherwise introduced.

Figure 9:
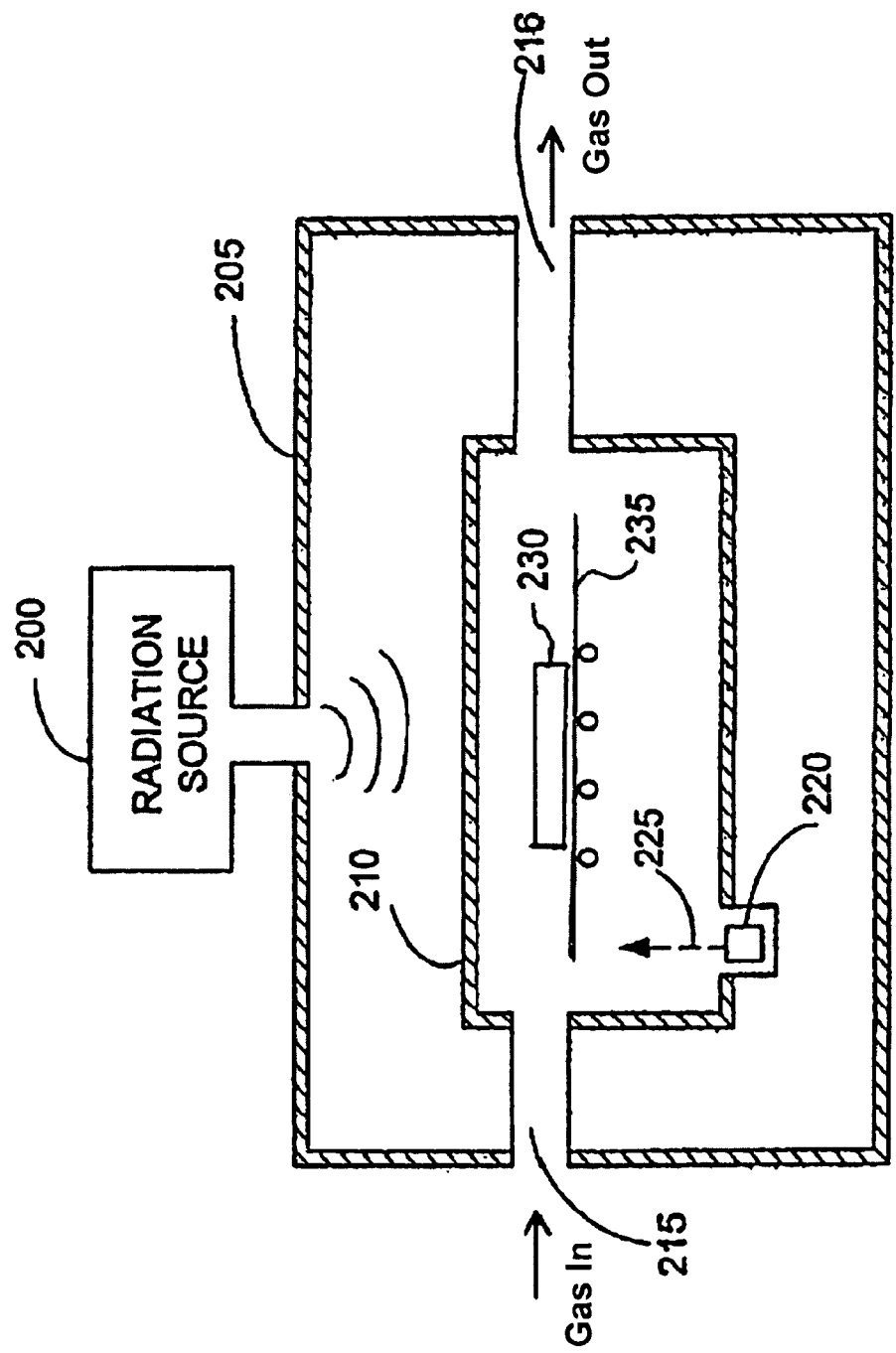
FIG. 9 shows an illustrative embodiment of a portion of a plasma heat treatment system for directing radiation into a plasma chamber consistent with this invention.

For example, FIG. 9 shows radiation source 200 directing radiation into chamber 205. Plasma cavity 210 can be positioned inside of chamber 205 and may permit a gas to flow there through via ports 215 and 216. Source 220 directs ionizing particles and/or radiation 225 into cavity 210. Source 220 can be protected from the radiation provided by source 200 and the plasma formed therefrom, for example, by a metallic screen that allows the ionizing particles to pass through but shields source 220 from the radiation. If necessary, source 220 can be water-cooled.

Examples of ionizing radiation and/or particles consistent with this invention can include x-rays, gamma radiation, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing an electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-Mode Radiation Cavities

A radiation waveguide, cavity, or chamber can be designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide or cavity, the mode can be any one of the various possible patterns of propagating or standing electromagnetic fields. Each mode is characterized by its frequency and polarization of the electric field and/or the magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of radiation propagation. Even though radiation appears to travel along the length of a waveguide, it may do so only by reflecting off the inner walls of the waveguide at some angle. Hence, depending upon the propagation mode, the radiation (e.g., microwave radiation)

may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero")). The subscripts normally specify how many "half waves" at the guide wavelength are contained in the x and y directions. It will be appreciated by those skilled in the art that the guide wavelength can be different from the free space wavelength because radiation propagates inside the waveguide by reflecting at some angle from the inner walls of the waveguide. In some cases, a third subscript can be added to define the number of half waves in the standing wave pattern along the z-axis.

For a given radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of a radiation reflector). This redistribution desirably provides a more uniform time-averaged field distribution within the cavity.

A multi-mode processing cavity consistent with this invention can support at least two modes, and may support many more than two modes. Each mode has a maximum electric field vector. Although there may be two or more modes, one mode may be dominant and may have a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the radiation energy is in the cavity.

The distribution of plasma within a heat treatment processing cavity may strongly depend on the distribution of the applied radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode processing cavity is used consistent with this invention, it will be appreciated by those of ordinary skill in the art that the cavity in which the plasma is formed can be completely closed or partially open. For example, in certain applications, such as in plasma-assisted furnaces, the cavity could be entirely closed. See, for example, commonly owned, concurrently filed U.S. patent application Ser. No PCT/US03/14133, which is fully incorporated herein by reference. In other applications, however, it may be desirable to flow a gas through the cavity, and therefore the cavity must be open to some degree. In this way, the flow, type, and pressure of the flowing gas can be varied over time. This may be desirable because certain gases that facilitate formation of plasma, such as argon, for example, are easier to ignite but may not be needed during subsequent plasma processing.

Mode-Mixing

For many heat treatment applications, a cavity containing a substantially uniform plasma is desirable. Therefore, consistent with one aspect of this invention, the radiation modes in a multi-mode cavity can be mixed, or redistributed, over a period of time to provide a more uniform radiation field distribution. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the heat treatment cavity. The shape and motion of the reflective surface can change the reflective properties of the inner surface of the cavity, as a whole, during motion. For example, an "L" shaped metallic object (i.e., "mode-mixer") when rotated about any axis will change the location or the orientation of the reflective surfaces in the cavity and therefore change the radiation distribution therein. Any other asymmetrically shaped object can also be used (when rotated), but symmetrically shaped objects can also work, as long as the relative motion (e.g., rotation, translation, or a combination of both) causes some change in the location or orientation of the reflective surfaces. In one embodiment, a mode-mixer can be a cylinder that is rotatable about an axis that is not the cylinder's longitudinal axis.

Each mode of a multi-mode heat treatment cavity may have at least one maximum electric field vector, but each of these vectors could occur periodically across the inner dimension of the cavity. Normally, these maxima are fixed, assuming that the frequency of the radiation does not change. However, by moving a mode-mixer such that it interacts with the radiation, it is possible to move the positions of the maxima. For example, mode-mixer 38 can be used to optimize the field distribution within heat treatment cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heat treating).

Thus, consistent with this invention, mode-mixing can be useful during plasma ignition. For example, when an electrically conductive fiber is used as a plasma catalyst, it is known that the fiber's orientation can strongly affect the minimum plasma-ignition conditions. When such a fiber is oriented at an angle that is greater than 60° to the electric field, for example, the catalyst does little to improve, or relax, these conditions. By moving a reflective surface either in or near the heat treatment cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process.

If the flexible waveguide is rectangular, for example, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent heat treatment processes and other types of plasma processing to reduce or create (e.g., tune) "hot spots" in the chamber. When a cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or heat treatment events. Thus, the plasma catalyst can be located at one or more of those ignition or subsequent heat treatment (e.g., plasma processing) positions.

Multi-Location Ignition

A heat treatment plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a plasma is modulated at a high frequency (i.e., tens of Hertz and higher), or ignited in a relatively large volume, or both, substantially uniform instantaneous striking and restriking of the plasma can be improved. Alternatively, when plasma catalysts are used at multiple points, they can be used to sequentially ignite a heat treatment plasma at different locations within a plasma chamber by selectively introducing the catalyst at those different locations. In this way, a heat treatment plasma ignition gradient can be controllably formed within the cavity, if desired.

Also, in a multi-mode heat treatment cavity, random distribution of the catalyst throughout multiple locations in the cavity can increase the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the heat treatment cavity.

Dual-Cavity Plasma Igniting/Sustaining

A dual-cavity arrangement can be used to ignite and sustain a plasma consistent with this invention. In one embodiment, a system includes at least an ignition cavity and a heat treatment cavity in fluid communication with the ignition cavity. To ignite a plasma, a gas in the ignition cavity can be subjected to electromagnetic radiation having a frequency less than about 333 GHz, optionally in the presence of a plasma catalyst. In this way, the proximity of the ignition and heat treatment cavities may permit a plasma formed in the ignition cavity to ignite a heat treatment plasma in the heat treatment cavity, which may be modulated or sustained with additional electromagnetic radiation.

In one embodiment of this invention, the ignition cavity can be very small and designed primarily, or solely, for plasma ignition. In this way, very little microwave energy may be required to ignite the plasma, permitting easier ignition, especially when a plasma catalyst is used consistent with this invention.

In one embodiment, the ignition cavity may be a substantially single mode cavity 12 and the heat treatment cavity may be a multi-mode cavity 12A, as shown in FIG. 12. When the ignition cavity only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used, it need not be placed in the electric field maximum and, many cases, need not be oriented in any particular direction.

Illustrative Heat Treatment Processes

Consistent with the invention, there may be provided one or more methods of plasma-assisted heat treatment. These methods may include, for example, hardening, annealing, normalizing, spheroidizing, tempering, any combination of these processes, or any other process for heat treating a material.

In an illustrative embodiment of the invention, a heat treating plasma may be initiated within a cavity, as described above, by subjecting a gas (supplied by gas source 24, for example) to radiation (e.g., microwave radiation) in the presence of a plasma catalyst. As shown in FIG. 1, this plasma initiation may occur within cavity 12, which may be formed in a vessel positioned inside microwave chamber (i.e., applicator) 14. The plasma source gas may be supplied to the cavity substantially simultaneously or at different times with the radiation used to initiate the plasma.

The initiated plasma may be modulated or sustained by supplying additional radiation to the cavity. Plasma efficiently absorbs radiation, and therefore, the temperature of the plasma may be precisely controlled by the amount of radiation supplied to the plasma. Heat from the plasma may also be efficiently transferred to objects. For example, during a heat treatment process consistent with the invention, an object 16 to be heat-treated may be exposed to the plasma initiated in the cavity. Through this exposure, energy from the plasma may be transferred from the plasma to the object 16. The amount of energy transferred from the plasma to the object 16 is a function of the power level of the radiation supplied to the plasma and the exposure of the object 16 to the plasma. The temperature of the object 16, therefore, may be precisely controlled by adjusting the amount of radiation supplied to the plasma and by, for example, controlling the percentage of the total surface area of the object 16 exposed to the plasma.

Energy can be transferred from the plasma to an object 167 (FIG. 6) at any desirable rate. For example, heating of the object 167 may proceed slowly by supplying low power level radiation to the plasma and/or by limiting the amount of exposure, by using a mask 172, between the object 167 and the plasma. By increasing the radiation power level and/or the amount of the object 167 exposed to the plasma, however, the rate of increase of the temperature of an object 167 may be increased.

A plasma-assisted heat treatment may be achieved by exposing an object to a plasma for a period of time sufficient to alter at least one material property of the object. Thus, the temperature of an object can be adjusted by variable plasma exposure. At certain critical temperatures, the material properties of an object may change. The amount of time that the temperature of the object is maintained above or below certain critical temperatures may also affect the material properties of the object. In a plasma-assisted heat treatment process of the present invention, therefore, time and temperature, are two parameters that may be controlled to yield a desired set of material properties. Various material properties, including, for example, at least one of hardness, grain size, toughness, crystal structure, ductility, elasticity, density, optical reflectivity, electrical conductivity, thermal conductivity, electron mobility, magnetic susceptibility, carbon content, and porosity, may be altered or controlled using the plasma-assisted heat treatment process consistent with the present invention.

Figure 10:
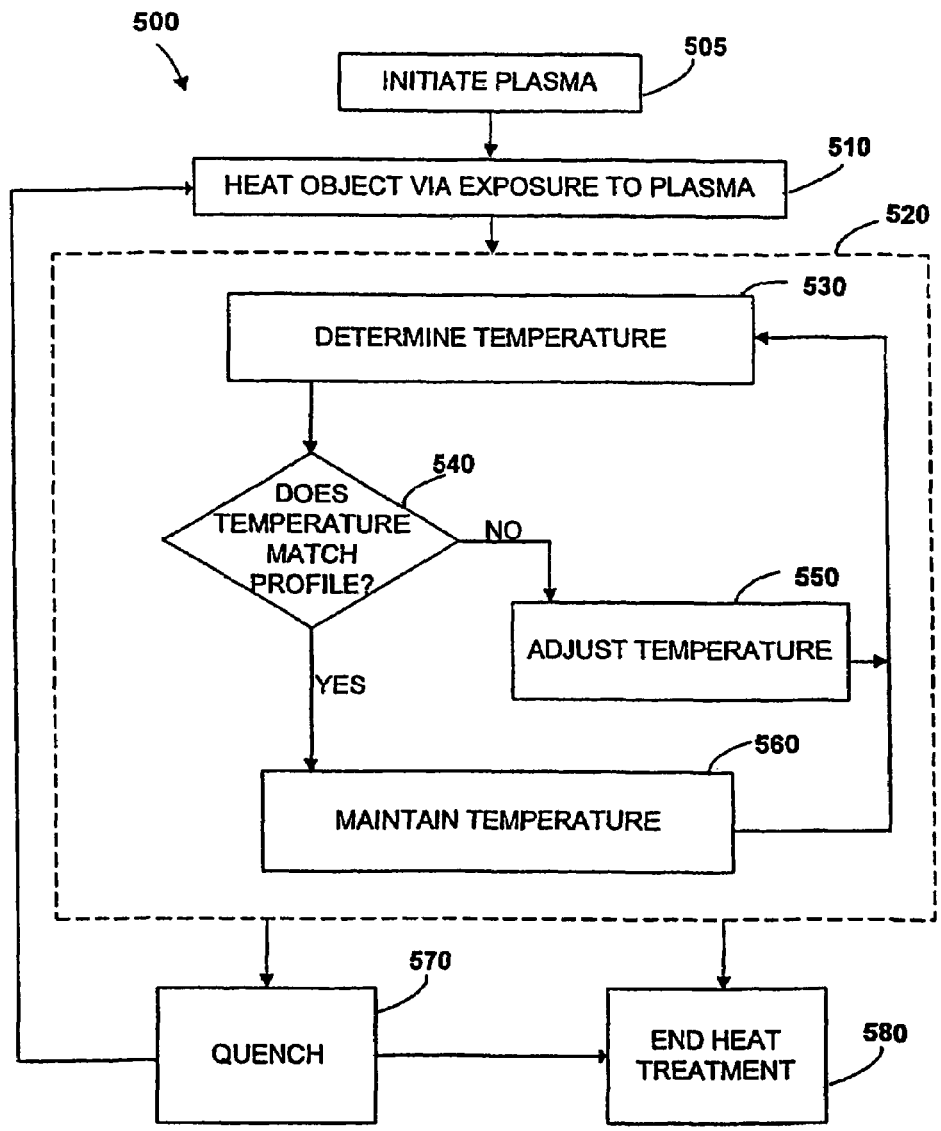
FIG. 10 shows a flow diagram of an illustrative embodiment of a plasma-assisted heat treatment method consistent with this invention.

FIG. 10 shows a flow diagram of an illustrative heat treatment method 500 consistent with the invention. In step 505, a plasma may be initiated. As described above, initiation may involve the use of a passive or active plasma catalyst. By exposing at least a portion of an object 167, by using a mask 172 to the plasma in step 510, energy may be transferred from the plasma to the object 167, and the temperature of the object 167 may be increased. In certain circumstances, the temperature of the object 167 may be decreased through exposure to the plasma. For example, in processes where the temperature of the object 167 is already elevated, and where the temperature of the initiated plasma is less than that of the object 167, energy may be transferred from the object to the plasma.

A plasma-assisted heat treatment process consistent with this invention may be controlled with a feedback loop. For example, feedback loop 520 can be used to control a process according to a predetermined time-temperature profile. The profile may be user-selected and computer- or human-implemented. For example, although method 500 is described herein below as using an automated controller to monitor and control the heat treatment process, a user may be responsible for performing one or more of the steps shown in FIG. 10. Referring back to FIG. 1, a temperature sensor (e.g., an optical pyrometer) may be used to monitor the temperature of an object to be heat treated. Thus, in step 530, controller 44 (e.g., a computer) may read the output of temperature sensor 42 to determine the temperature of the object or another temperature associated with the process. Controller 44 may be programmed to monitor the output of temperature sensor 42 at any suitable interval of time. For example, intervals of less than one second may be used for nearly continuous monitoring of the temperature. Periodic monitoring using longer intervals of time is also possible and may be more suitable in certain applications.

Once a temperature has been determined in step 530, controller 44 may compare the measured temperature to a predetermined time-temperature profile in step 540. If the measured temperature falls outside the time-temperature profile, then the power level of radiation source 26, for example, may be adjusted in step 550. For example, if the object temperature is too high, then controller 44 may signal power supply 28 to reduce the power supplied to radiation source 26. A reduction in power supplied to radiation source 26 can reduce the intensity of the plasma. As a result, the temperature of the plasma may be reduced, and, as a result, the temperature of the object may be decreased. Conversely, if the measured temperature is too low, then controller 44 may signal power supply 28 to increase the power supplied to radiation source 26 thereby increasing the temperature of the plasma.

The temperature may also be adjusted in step 550 by varying plasma exposure. For example, the plasma can be exposed to a variable surface area of the object. That is, the temperature of an object can be more rapidly increased by increasing the exposed surface area (e.g., repositioning the object with respect to the plasma).

It will be appreciated that if the temperature determined in step 530 matches the temperature profile after comparison in step 540, then the temperature can be maintained in step 560. This can be achieved, for example, by maintaining the power to the radiation source, or by any other control parameter, such as gas flow rate.

Thus, nearly any conceivable time-temperature profile may be achieved with a high degree of control in a plasma-assisted heat treatment process consistent with the present invention. For example, heat treatment may involve simply heating an object to a temperature that is at or above some predetermined temperature and then maintaining that temperature for a certain amount of time before cooling the object. Alternatively, a plasma-assisted heat treatment process may include any number of target temperature-time cycles. For example, the temperature of an object may be maintained at a first target temperature for a first period of time, increased or decreased to a second target temperature over a second period of time, and this second temperature may be maintained for a third period of time. This process may be performed repeatedly, if desired, for any number of target temperatures. It will be appreciated that each target temperature may be a discrete temperature or a range of temperatures.

A cooling cycle or period may be included in the predetermined time-temperature profile consistent with this invention. As described above, this cooling may result, for example, by reducing the amount of energy supplied to the plasma or by controlling the level of exposure of the object to the plasma. In certain plasma-assisted heat treatment processes, it may be desirable to cool the object faster than the maximum cooling rate available, for example, by reducing plasma power or plasma exposure. In these processes, the object may be cooled by quenching in step 570 by any conventional technique (e.g., water spray or immersion, oil bath, gas flow, etc.).

The heat treatment may be stopped in step 580 at any time. In certain cases, the process may end after the temperature of the object has been reduced to ambient temperature or below some non-critical temperature. In other cases, the plasma may be extinguished and the object can be allowed to cool on its own. The plasma may also be restarted and the object exposed to the plasma, however, if the object cools too quickly.

Returning to step 505, a heat treating plasma consistent with the invention may be initiated using a plasma catalyst. While a heat treating plasma may be initiated without the use of a plasma catalyst, the presence of a passive or active plasma catalyst consistent with this invention may reduce the radiation energy density needed to initiate a heat treating plasma. This reduction may allow a plasma to be generated in a controlled manner with a relatively low amount of radiation energy, which can be useful when sensitive portions of an object 16 are exposed to the heat treating plasma. In one embodiment, the plasma may be initiated using a time-averaged radiation energy (e.g., microwave energy) density below about 10 W/cm$^3$. Further, the plasma may be initiated using a time-averaged radiation energy density below about 5 W/cm$^3$. Advantageously, plasma ignition can be achieved at these relatively low energy densities without the use of vacuum equipment.

In addition to ignition, the use of a plasma catalyst may facilitate control over any portion of the plasma-assisted heat treatment process. Specifically, because plasma can be an efficient absorber of electromagnetic radiation, including microwave radiation, any radiation used to initiate the heat treating plasma may be mostly and immediately absorbed by the plasma. Therefore, the radiation energy directed into a heat treatment cavity may be less subject to reflection at the early stages of generating the plasma. As a result, a plasma catalyst may be used to increase control over the heating rate of an object exposed to the plasma, the temperature of an object, or any other plasma-assisted process.

The use of a plasma catalyst may also enable initiation of a heat treating plasma over a broad range of pressures including pressures less than, equal to, or greater than atmospheric pressure. For example, a catalyzed heat treating plasma consistent with the invention may be ignited and sustained not only in vacuum environments, where the total pressure is less than atmospheric pressure (i.e., about 760 Torr), but also at pressures at or above atmospheric pressure.

Heat treatment processes consistent with the invention may be performed on an entire object or any portion thereof. By selectively heat treating only a portion of an object, the material properties of various sections of the object may be individually controlled and altered. For example, certain portions of an object may be heat treated in such a way as to exhibit a certain material property (e.g., high ductility). Other portions of the same object, however, may be heat treated in a different way to provide another, and even opposite material property (e.g., high hardness).

Selective heat treatment of only a portion of an object 167 may be accomplished by effectively masking 172 certain areas of the object 167 from the heat treatment plasma. For example, cavity 12 may be configured in such a way as to prevent exposure of certain surface regions of the object 167 to the plasma. As previously discussed, the number or order of modes of the radiation in cavity 12 may depend on the size or configuration of the cavity. The presence of an object 167 to be heat treated within cavity 12 may also affect the field distribution in the modes of radiation within the cavity. The boundary conditions for normal incidence of electromagnetic radiation on metallic objects require that the electric field at the surface be zero and the first maxima occur at a distance of a quarter wavelength from the surface of the object 167. Consequently, if the gap between the surface of the metallic object and the inner wall of the cavity is less than about a quarter wavelength of the radiation, little or no heat treating plasma may be sustained in these areas, and the regions of the object 167 satisfying this condition may experience little or no heat treatment. These "masked" surface regions may be provided through positioning of the object 167 within cavity 12, by configuring the walls of cavity 12, or by any other suitable method for controlling the distance between the surface of the object 167 and the cavity walls.

A second method for substantially preventing heat treatment of a particular region of the object may include orienting the object with respect to cavity 12 such that at least a portion of the object is located within the cavity and another portion of the object is located outside of the cavity. The portion within the cavity may be heat treated, and the portion located outside the cavity may remain substantially free of heat treatment.

It will be appreciated by those of ordinary skill in the art that the plasma-assisted heat treatment methods consistent with this invention need not occur within a cavity at all. Rather, a heat treatment plasma formed in a cavity can be flowed through an aperture and used outside the cavity to heat an object.

In order to generate or maintain a substantially uniform time-averaged radiation field distribution within cavity 12, mode mixer 38 may be provided, as shown in FIG. 1. Alternatively, or additionally, the object 16 may be moved with respect to the plasma while being exposed to the plasma. Such motion may provide more uniform exposure of all surface regions of the object 16 to the plasma, which may cause more uniform heating of the object 16 or may assist in heating certain areas of the object 16 more rapidly than other areas.

An electric potential bias may be applied to the object during the plasma-assisted heat treatment processes consistent with the invention. Such a potential bias may facilitate heating of the object by attracting the charged ions in the plasma to the object. Such an attraction may encourage uniform coverage of the plasma over the object and contribute to more uniform heating of the object. The potential bias applied to the object may be, for example, an AC bias, a DC bias, or a pulsed DC bias. The magnitude of the bias may be selected according to a particular application. For example, the magnitude of the voltage may range from 0.1 volts to 100 volts, or even several hundred volts depending on the desired rate of attraction of the ionized species. Further, the bias may be either positive or negative.

Figure 11:
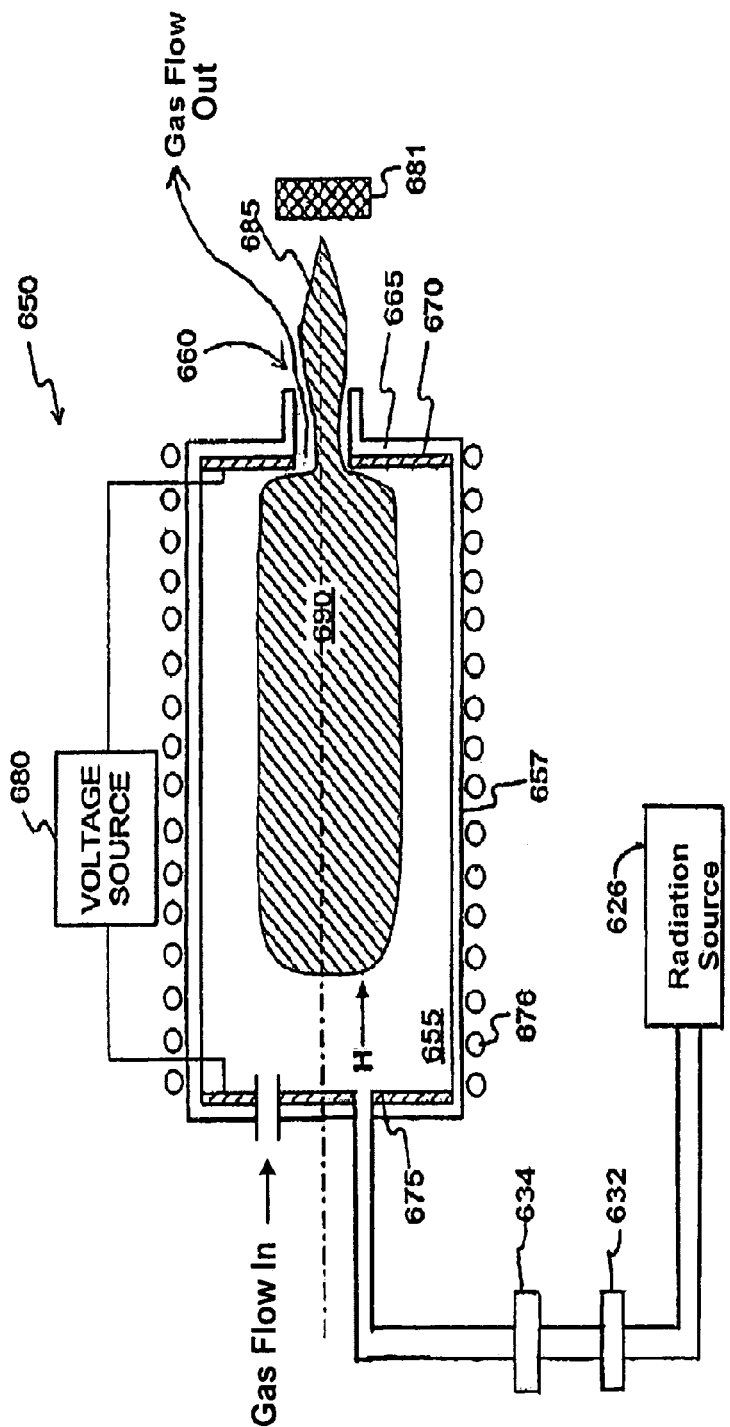
FIG. 11 shows an illustrative plasma-jet apparatus consistent with this invention.

FIG. 11 shows illustrative apparatus 650 for forming a heat treating plasma-jet for heat treating objects consistent with this invention. Apparatus 650 can include vessel 657, in which cavity 655 can be formed, and a gas source (not shown) for directing a gas into cavity 655, illustrated by "Gas Flow In"arrow. Cavity 655 can include at least one aperture 660 formed in cavity wall 665. An electromagnetic radiation source for directing electromagnetic radiation into cavity 655 and a plasma catalyst for relaxing the plasma ignition, modulation, and sustaining conditions can also be included, although they are not necessary, nor are they shown in FIG. 11 for illustrative simplicity. [In amended FIG. 11, the electromagnetic radiation source includes radiation source 626, circulator 632, and tuner 634, similar to the elements shown in FIG. 1 and described in paragraphs 032 and 033, as would be appreciated by a person having ordinary skill in the art.] Additional methods and apparatus for forming a plasma-jet are described in commonly owned, concurrently filed PCT Application No. PCT/US03/14122, which is hereby incorporated by reference in its entirety.

Consistent with this invention, cavity 655 can include electrically conductive and substantially thermally resistant inner surface 670, which can be proximate to aperture 660, electrically conductive surface 675, which faces surface 670, and voltage source 680, which can apply a potential difference between surfaces 670 and 675. Magnetic field H can also be applied to the plasma by passing an electric current through coil winding 676, which can be external or internal to vessel 657.

A method for forming plasma-jet 685 at aperture 660 can also be provided. The method can include (1) flowing a gas into cavity 655, (2) forming plasma 690 from the gas in cavity 655, (3) allowing at least a portion of plasma 690 to pass out of cavity 655 through aperture 660 such that plasma-jet 685 is formed outside cavity 655 proximate to aperture 660, and (4) applying an electric potential between surfaces 670 and 675 and/or passing an electric current through coil 676.

Application of an electric potential between surfaces 670 and 675 can cause plasma 690 to accelerate charged particles to move towards the aperture 660. Surfaces 670 and 675 can be disposed on, or be integral with, vessel 657. Alternatively, surfaces 670 and 675 can be separate from the internal surface of vessel 657. In this case, these surfaces can be plates or screens that are suspended or otherwise mounted in cavity 655. Alternatively, surfaces 670 and 675 can be discs or rings or any other part having a convenient shape configured for use in plasma cavity 655.

Magnetic field H can be generated by passing a current through coil 676 and applied to plasma 690. The magnetic field can exert a deflecting force on the charged particles that try to move perpendicular to the magnetic field. Consequently, charged particles in the plasma will not be able to move out radially (i.e., perpendicular to the longitudinal axis of coil 676) and, as a result, the inner surface of cavity 655 close to coil 676 will be heated less. In addition, because the plasma will tend toward the axis of coil 676, a hotter and more efficient plasma-jet can be formed.

The potential can be applied between surfaces 670 and 675 during any time period including before the formation of plasma 690, during the formation of plasma 690, and after the formation of plasma 690. It is believed that the principal benefit may result when the potential is applied while the plasma is formed (that is, while the plasma is being modulated or sustained) in cavity 655. Also, the magnetic field can be applied at any time, including before, during, or after plasma formation. As a result, one or more plasma characteristics (e.g., physical shape, density, etc.) can be varied by applying a potential between surfaces 670 and 675 and a current through coil 676.

The applied potential can cause surface 670 to be more positive or more negative than surface 675. In one embodiment, positively charged ions of atoms and molecules within plasma 690 can be attracted toward surface 670 by applying a relatively negative potential to surface 670. Because the positive ions, which are attracted by negative surface 670, will transfer at least some of the kinetic energy to surface 670, surface 670 can be made from a material that can withstand relatively high temperatures (e.g., 1,000 degrees Fahrenheit and above). In one embodiment, that surface can include molybdenum, which is also electrically conductive.

In another embodiment, surface 670 can include two or more layers. The outer layer, which faces or contacts plasma 690 during operation, can be selected to withstand very high temperatures (although not necessarily electrically conductive). The under layer, then, can be electrically conductive, but not necessarily capable of withstanding very high temperatures. Additional layers can be used as well to enhance its heat-resistance and/or its electrical conductivity.

An electric potential can also be applied between vessel 657 and a work piece 681 located outside cavity 655 to accelerate plasma 690 through aperture 660 toward a surface of work piece 681. When a sufficient electric current flows through the work piece, the temperature of the work piece can be increased through a resistive heating as well as from the increased kinetic energy of the charged particles striking the work piece.

The plasma-assisted heat treatment processes of the present invention may be used to treat any material in which one or more properties may be controlled or altered through the application of heat. For example, a plasma-assisted heat treatment process of the present invention may be used to treat steel.

Plasma-assisted heat treatment processes consistent with the invention may be used to heat treat various types of objects. For example, gears, fasteners, casings, engine components, automotive components, braking components, support members, load-bearing members, parts subject to frictional wearing forces, and any combination thereof can be treated. These objects may be continuously or batch treated by entering cavity 12 through an input and by exiting cavity 12 through an output (not shown). Additionally, a conveyor 235 may be used to transport the object 230 shown in FIG. 9, through cavity 12 of FIG. 1 via the vessel input and output.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A method of heat treating an object to provide different material properties at discrete portions of the object with respect to the rest of the object, the method comprising:
    initiating a heat treating plasma within a cavity by subjecting a gas to electromagnetic radiation having a frequency less than about 333 GHz in the presence of a plurality of passive plasma catalysts that are introduced into the plasma at different locations corresponding to the discrete portions of the object;
    masking the object by mode-mixing the electromagnetic radiation;
    applying the plasma to the object to heat the object to a temperature of between approximately 2,000 degrees Fahrenheit and approximately 3,000 degrees Fahrenheit by the plasma; and
    adjusting the temperature of the discrete portions of the object by adjusting an amount of electromagnetic radiation to the plasma adjacent said discrete portions while adjusting a plasma catalyst component ratio of the plurality of passive plasma catalysts that are introduced into the plasma proximate said discrete portions for a first period of time sufficient to alter at least one material property of said discrete portions of the object.

2. The method of claim 1, wherein the heating comprises a heat treatment selected from a group consisting of hardening, annealing, normalizing, spheroidizing, tempering, and any combination thereof.

3. The method of claim 1, wherein the initiating comprises:
    supplying the gas to the cavity; and
    supplying the electromagnetic radiation to the cavity.

4. The method of claim 3, wherein the supplying the electromagnetic radiation and the supplying the gas are performed substantially simultaneously.

5. The method of claim 1, wherein the heating comprises sustaining the plasma with additional electromagnetic radiation.

6. The method of claim 1, wherein the cavity has an initial gas pressure of at least about atmospheric pressure.

7. The method of claim 1, further comprising:
maintaining the object at a first temperature for a first period of time;
maintaining the temperature of the object at the second temperature for a third period of time,
the temperature adjusting step including changing the temperature of the object to a second temperature over a second period of time.

8. The method of claim 1, further comprising quenching the object.

9. The method of claim 1, wherein the plurality of passive plasma catalysts includes at least one of powdered carbon, carbon nanotubes, carbon nanoparticles, carbon fibers, graphite, solid carbon, and any combination thereof.

10. The method of claim 1, wherein the plurality of passive plasma catalyst includes at least one of a metal, carbon, a carbon-based alloy, a carbon-based composite, an electrically conductive polymer, a conductive silicone elastomer, a polymer nanocomposite, an organic-inorganic composite, and any combination thereof.

11. The method of claim 1, wherein the object has a first region and a second region, and wherein the step of applying further includes exposing the first region to the plasma and substantially preventing exposure of the second region to the plasma.

12. The method of claim 11, further comprising:
sustaining the plasma with additional electromagnetic radiation; and
positioning the object within the cavity such that the second region is separated from an inner wall of the cavity by a distance of less than about 25% of the wavelength of the electromagnetic radiation.

13. The method of claim 11, further comprising positioning the object with respect to the cavity such that the second region is located outside of the cavity.

14. The method of claim 1, wherein the at least one material property includes at least one of hardness, grain size, toughness, crystal structure, ductility, elasticity, density, optical reflectivity, electrical conductivity, thermal conductivity, electron mobility, magnetic susceptibility, carbon content, and porosity.

15. The method of claim 1, wherein the object comprises iron.

16. The method of claim 1, wherein the object is a gear, a fastener, a casing, an engine component, an automotive component, a braking component, a support member, a load-bearing member, a part subject to frictional wearing forces, and any combination thereof.

17. The method of claim 1, step of applying further comprises a step of moving the object with respect to the plasma.

18. The method as recited in claim 1, wherein masking at least one portion of the object by mode-mixing the electromagnetic radiation, includes providing a movable reflective surface that is adapted to change locations or orientations of reflective surfaces within the cavity.

19. The method as recited in claim 1, each of the plurality of passive plasma catalysts having a plasma catalyst component ratio of electrically conductive components to additives that is variable, the method comprising selectively varying the ratio of electrically conductive components to additives between passive plasma catalysts introduced at different locations.

20. The method as recited in claim 19, wherein passive plasma catalysts of the plurality of passive plasma catalysts are introduced into the plasma at least one of different times and different rates.

21. The method as recited in claim 1, the method further comprising sequentially igniting passive plasma catalysts at the different locations to provide a plasma ignition gradient.

22. The method as recited in claim 1, the method further comprising adjusting the temperature of any portion of the object by adjusting an amount of electromagnetic radiation to the plasma adjacent said portion for a second period of time sufficient to alter another at least one material property of the object.

23. A system for heat treating an object to provide different material properties at discrete portions of the object with respect to the rest of the object, the system comprising:
a plurality of passive plasma catalysts;
a vessel that is disposed in an applicator, in which a first cavity of the vessel is formed and in which a plasma can be initiated by subjecting a gas to electromagnetic radiation having a frequency of less than about 333 GHz in the presence of the plurality of passive plasma catalysts that are introduced into the first cavity at different locations corresponding to the discrete portions of the object,
the plasma and the object each being heated to a temperature between approximately 2,000 degrees Fahrenheit and approximately 3,000 degrees Fahrenheit;
an electromagnetic radiation source coupled to the first cavity for supplying the electromagnetic radiation to the first cavity;
a gas inlet arranged on the vessel for connection to a gas source for providing a gas;
a detector for monitoring a temperature associated with the object;
a controller that adjusts a power level of the electromagnetic radiation source based on the temperature by adjusting an amount of electromagnetic radiation to the plasma adjacent said discrete portions while adjusting a plasma catalyst component ratio of the plurality of passive plasma catalysts that are introduced into the plasma proximate said discrete portions; and
a mode mixer that can move relative to the applicator for masking desired portions of said object from said plasma.

24. The system of claim 23, wherein the vessel is at least partially formed by a surface region of the object.

25. The system of claim 24, wherein the vessel has at least an object input and an object output, the system further comprising a conveyor for conveying the surface region through the vessel via the input and output.

26. The system of claim 23, wherein the controller is programmed to control a power level of the electromagnetic radiation source such that the temperature associated with the object substantially conforms to a predetermined time-temperature profile.

27. The system of claim 23, wherein the applicator is a multi-mode applicator.

28. The system of claim 23, wherein the applicator includes an outer layer comprising a material that is substantially opaque to the electromagnetic radiation.

29. The system of claim 28, wherein the vessel comprises a material that is transmissive to radiation.

30. The system of claim 23, further comprising a second vessel in which a second cavity is formed, wherein the first cavity is connected to the second cavity, and wherein the heat treating occurs in the second cavity.

31. The system of claim 23, wherein the plurality of passive plasma catalyst includes at least one material selected from the group consisting of
   powdered carbon,
   carbon nanotubes,
   carbon nanoparticles,
   carbon fibers,
   graphite, and
   solid carbon.

32. The system of claim 23, wherein the plurality of passive plasma catalyst includes at least one material selected from the group consisting of
   a nitrogen-containing compound,
   a metal, carbon, a carbon-based alloy,
   a carbon-based composite,
   an electrically conductive polymer,
   a conductive silicone elastomer,
   a polymer nanocomposite, and
   an organic-inorganic composite.

33. The system as recited in claim 23, wherein the mode mixer is a movable reflective surface that is adapted to change locations or orientations of reflective surfaces within the cavity.

34. The system as recited in claim 33, wherein the mode mixer is a symmetrically or non-symmetrically shaped object that can be rotated about an axis.

* * * * *